US012744090B2

(12) United States Patent
Yang et al.

(10) Patent No.: US 12,744,090 B2
(45) Date of Patent: Sep. 22, 2026

(54) NON-VOLATILE MEMORY WITH LOCATION DEPENDENT BITLINE VOLTAGE DURING PROGRAM-VERIFY FOR CURRENT SENSING COMPENSATION

(71) Applicant: Sandisk Technologies, Inc., Milpitas, CA (US)

(72) Inventors: Xiang Yang, Santa Clara, CA (US); Muhammad Masuduzzaman, Chandler, AZ (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/676,146

(22) Filed: May 28, 2024

(65) Prior Publication Data

US 2025/0372177 A1 Dec. 4, 2025

(51) Int. Cl.

| | |
|---|---|
| ***G11C 16/24*** | (2006.01) |
| ***G06F 17/16*** | (2006.01) |
| ***G11C 16/04*** | (2006.01) |
| ***G11C 16/10*** | (2006.01) |
| ***G11C 16/26*** | (2006.01) |
| ***G11C 16/34*** | (2006.01) |

(52) U.S. Cl.

CPC .............. *G11C 16/24* (2013.01); *G06F 17/16* (2013.01); *G11C 16/0483* (2013.01); *G11C 16/10* (2013.01); *G11C 16/26* (2013.01); *G11C 16/3459* (2013.01)

(58) Field of Classification Search

CPC ......... G11C 16/10; G11C 16/30; G11C 16/12; G11C 16/0483; G11C 16/3459

USPC ....................................... 365/185.18, 165.22

See application file for complete search history.

(56) References Cited

U.S. PATENT DOCUMENTS

| | | | |
|---|---|---|---|
| 7,821,854 B2 | 10/2010 | Kobayashi | |
| 8,023,319 B2 | 9/2011 | Cho et al. | |
| 9,449,698 B1 | 9/2016 | Paudel et al. | |
| 9,715,924 B2 | 7/2017 | Mokhlesi et al. | |
| 9,899,077 B2 | 2/2018 | Hsu et al. | |
| 9,978,456 B2 | 5/2018 | Khandelwal et al. | |
| 10,083,743 B2 | 9/2018 | Perner | |
| 10,528,643 B1 | 1/2020 | Choi et al. | |
| 11,544,547 B2 | 1/2023 | Kulkarni et al. | |
| 11,934,480 B2 | 3/2024 | Lue et al. | |
| 2006/0221692 A1 | 10/2006 | Chen | |
| 2009/0003078 A1* | 1/2009 | Mihnea ............. | G11C 16/3454 365/185.22 |
| 2020/0034697 A1 | 1/2020 | Choi et al. | |
| 2023/0154541 A1 | 5/2023 | Yuan et al. | |

(Continued)

*Primary Examiner* — Richard Elms

(74) *Attorney, Agent, or Firm* — PEARL COHEN LLP

(57) ABSTRACT

A non-volatile storage apparatus programs memory cells, including performing program-verify. The performing program-verify comprises applying location dependent bit line voltages to the bit lines connected to the memory cells. The location dependent bit line voltages are different in voltage magnitude for different locations based on distance from bit line drivers connected to the bit lines. The memory cells are read by applying, regardless of location, a common bit line voltage to the bit lines that is higher in voltage magnitude than the any of the location dependent bit line voltages. In one example implementation, the read process is used to perform in-memory vector-matrix multiplication.

18 Claims, 23 Drawing Sheets

(56) References Cited

U.S. PATENT DOCUMENTS

| | | | |
|---|---|---|---|
| 2023/0245706 | A1 | 8/2023 | Song et al. |
| 2023/0317169 | A1 | 10/2023 | Zhu et al. |

* cited by examiner

Storage System 100
Memory Controller 120
130
Memory
160
Memory Interface
158
ECC Engine
156
Processor
154
NOC
164
DRAM Controller
140
volatile memory
152
Host Interface
102
Host 207
201
280
282
211
282
276
284
284
278
201
284
282
282
276
211
284
284
280
278
201
282
282
276
211
284
280
278
271
274
272

Bit Line
414
417
472
474

DL
SGDT0
SGDT1
SGD0
SGD1
DD0
DD1
WL161
WL160
WL159
Wl158
WL157
WL156
WL155
WL154
WL153
WL152
429
WL82
WL81
DU
Joint
WL80
WL6
WL5
WL4
WL3
WL2
WL1
WL0
DS1
DS0
SGS1
SGS0
SGSB1
SGSB0
SL
454
453
z
x
y

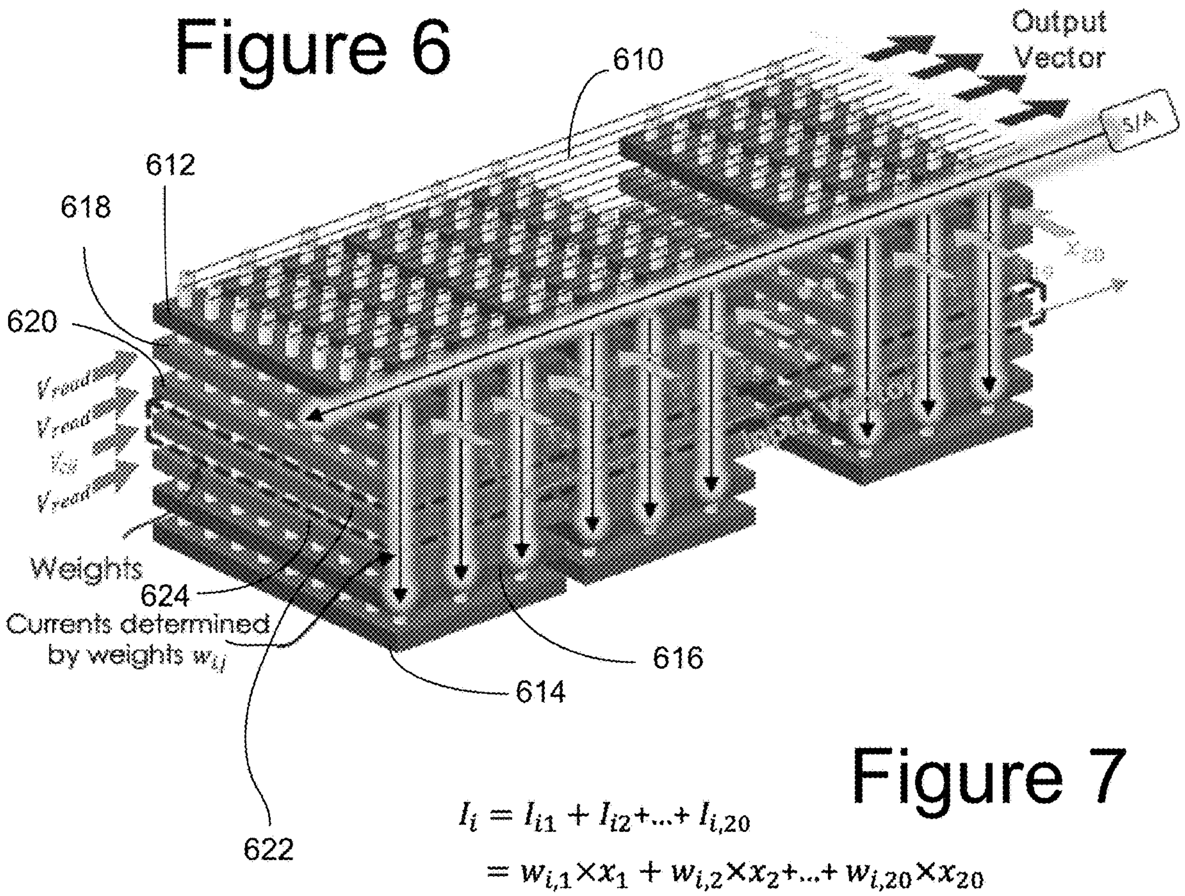

Figure 7

$$I_i = I_{i1} + I_{i2} + \ldots + I_{i,20}$$

$$= w_{i,1} \times x_1 + w_{i,2} \times x_2 + \ldots + w_{i,20} \times x_{20}$$

$$= \begin{bmatrix} w_{i,1}, w_{i,2}, \ldots, w_{i,20} \end{bmatrix} \times \begin{bmatrix} x_1 \\ x_2 \\ \vdots \\ x_{20} \end{bmatrix}$$

$x_1$ → 0: SGD off
1: SGD on

Figure 8

$$\text{Output Vector } \boldsymbol{I} = [I_1, I_2, \ldots, I_N] = \begin{bmatrix} w_{1,1}, w_{1,2}, \ldots, w_{1,N} \\ \vdots \\ w_{i,1}, w_{i,2}, \ldots, w_{i,N} \\ \vdots \\ w_{M,1}, w_{M,2}, \ldots, w_{M,N} \end{bmatrix} \times \begin{bmatrix} x_1 \\ x_2 \\ \vdots \\ x_N \end{bmatrix} = \boldsymbol{w} \times \boldsymbol{x}$$

Output vector (bitline current)

Weight (encoded by cell current)

Input vector ($SGD_i$ on/off)

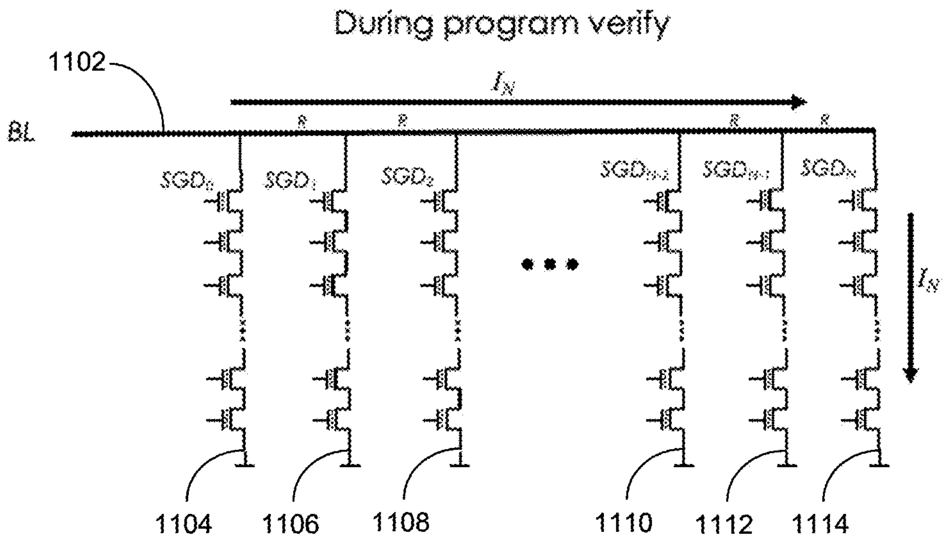
Figure 11B
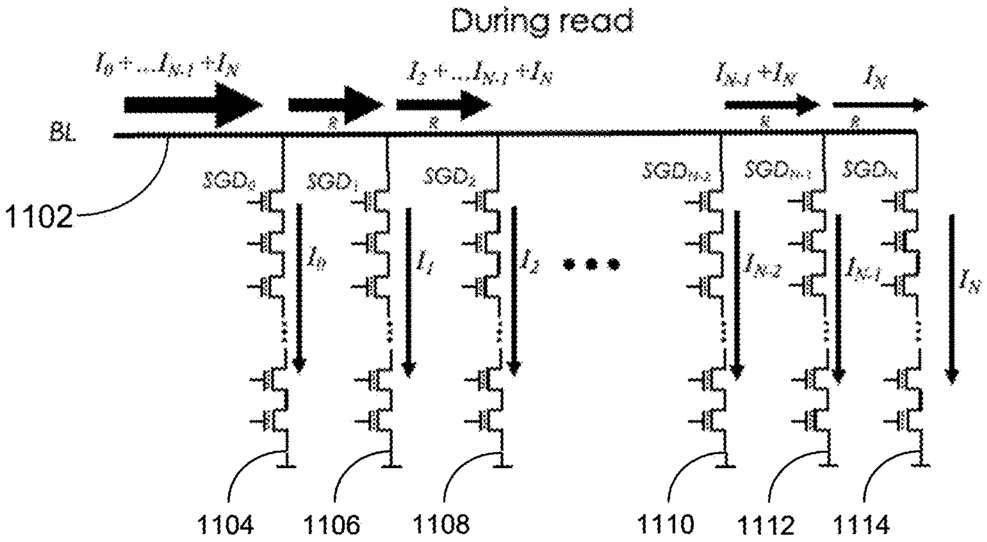

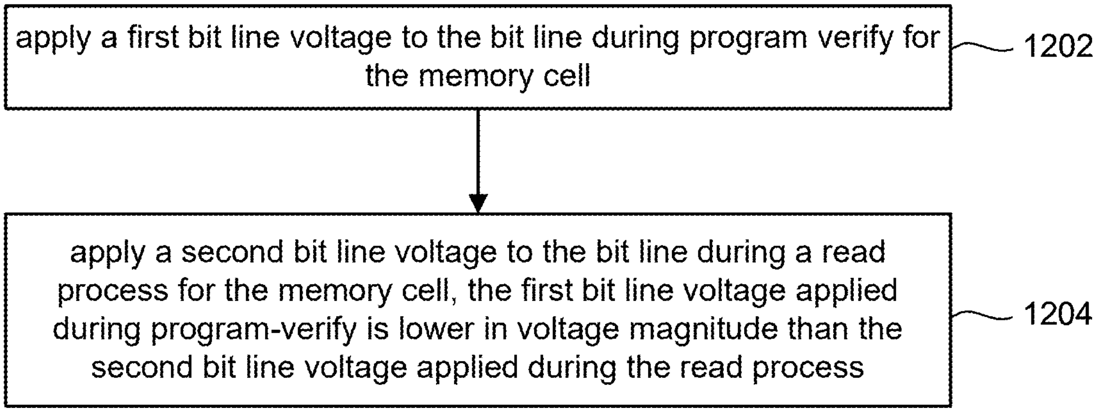

Figure 12

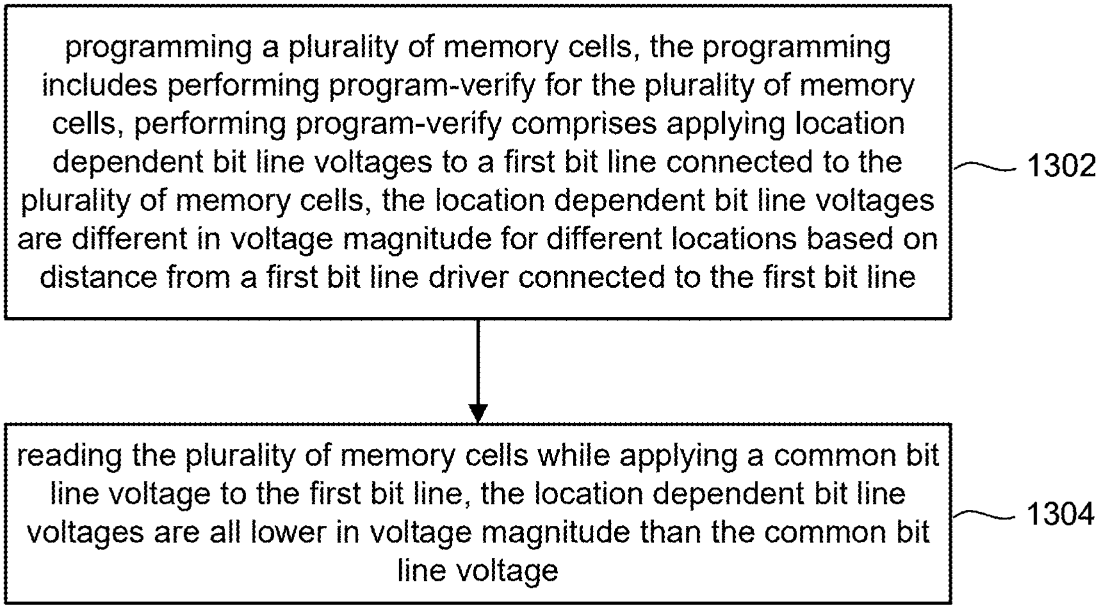

Figure 13 programming a plurality of memory cells, the programming includes performing program-verify for the plurality of memory cells, performing program-verify comprises applying location dependent bit line voltages to a first bit line connected to the plurality of memory cells, the location dependent bit line voltages are different in voltage magnitude for different locations based on distance from a first bit line driver connected to the first bit line

1302 reading the plurality of memory cells while applying a common bit line voltage to the first bit line, the location dependent bit line voltages are all lower in voltage magnitude than the common bit line voltage

1304

$$VBL\ (blk\ n,\ verify) = VBL_0 - n \times \alpha$$

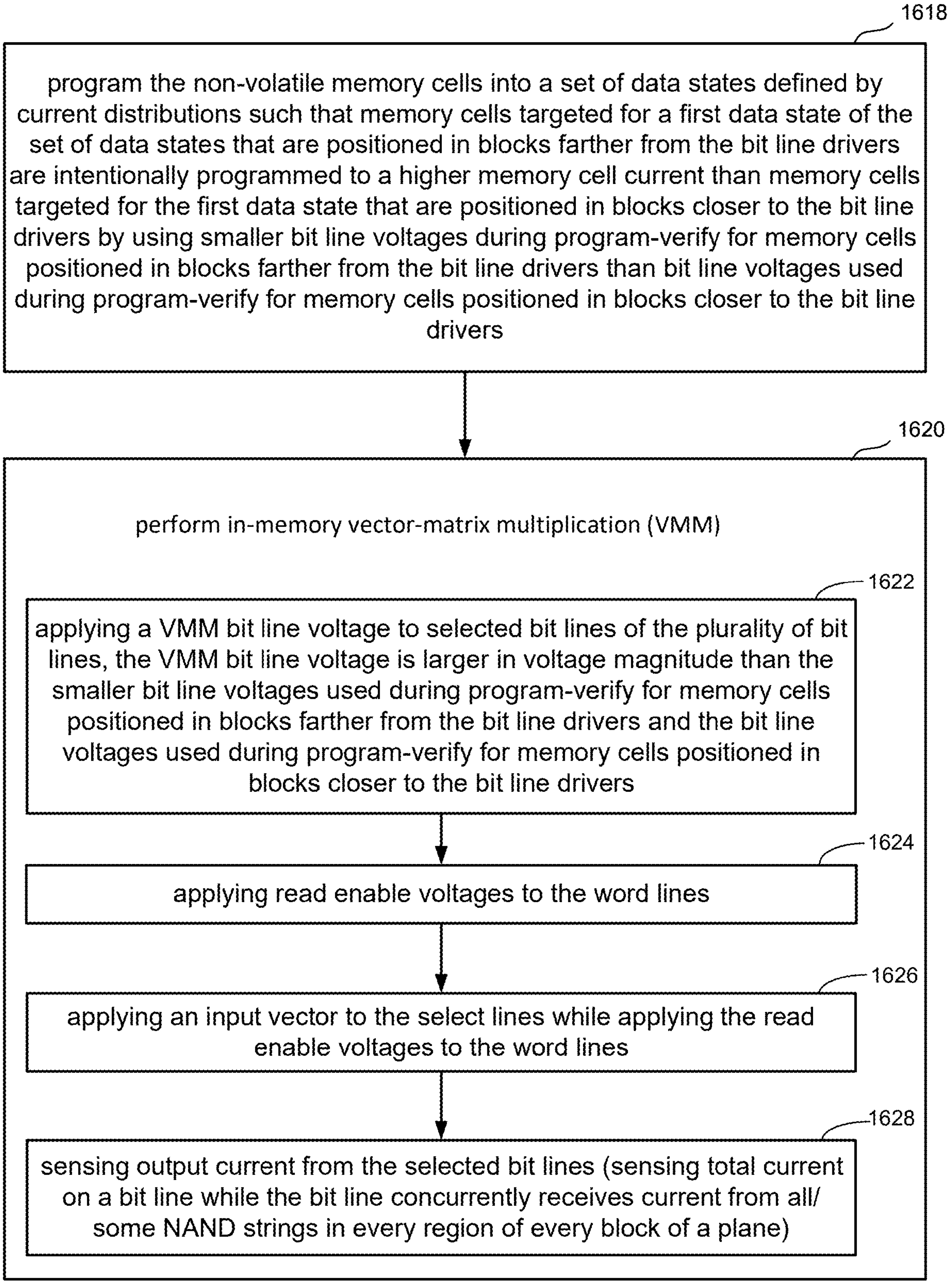

Figure 16

1618 program the non-volatile memory cells into a set of data states defined by current distributions such that memory cells targeted for a first data state of the set of data states that are positioned in blocks farther from the bit line drivers are intentionally programmed to a higher memory cell current than memory cells targeted for the first data state that are positioned in blocks closer to the bit line drivers by using smaller bit line voltages during program-verify for memory cells positioned in blocks farther from the bit line drivers than bit line voltages used during program-verify for memory cells positioned in blocks closer to the bit line drivers

1620 perform in-memory vector-matrix multiplication (VMM)

1622 applying a VMM bit line voltage to selected bit lines of the plurality of bit lines, the VMM bit line voltage is larger in voltage magnitude than the smaller bit line voltages used during program-verify for memory cells positioned in blocks farther from the bit line drivers and the bit line voltages used during program-verify for memory cells positioned in blocks closer to the bit line drivers

1624 applying read enable voltages to the word lines

1626 applying an input vector to the select lines while applying the read enable voltages to the word lines

1628 sensing output current from the selected bit lines (sensing total current on a bit line while the bit line concurrently receives current from all/ some NAND strings in every region of every block of a plane)

NON-VOLATILE MEMORY WITH LOCATION DEPENDENT BITLINE VOLTAGE DURING PROGRAM-VERIFY FOR CURRENT SENSING COMPENSATION

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory that the non-volatile memory operate reliably (e.g., user be able to successfully read back data stored in the non-volatile memory).

BRIEF DESCRIPTION OF THE DRAWINGS

Like-numbered elements refer to common components in the different figures.

FIG. 6 is a perspective view of a portion of one embodiment of a monolithic three dimensional memory structure.

FIGS. 7 and 8 provide mathematical details of performing vector-matrix multiplication on the structure of FIG. 6.

FIG. 11A depicts a voltage applied to a NAND string during program-verify.

FIG. 11B depicts a voltage applied to NAND strings during a read process.

FIG. 12 is a flow chart describing one embodiment of a process performed as part of program-verify and as part of a read process.

FIG. 13 is a flow chart describing one embodiment of a process performed as part of program-verify and as part of a read process.

FIG. 16 is a flow chart describing one embodiment of a process performed as part of program-verify and as part of a read process.

DETAILED DESCRIPTION

Some non-volatile memory systems program memory cells into data states corresponding to threshold voltage distributions or memory cell current distributions. The programming process includes performing program-verify to make sure that the memory cells being programmed have indeed reached their target data state. After successful programming, the data can be read from the memory cells. Both program-verify and reading include sensing memory cells, and the sensing process includes applying appropriate bit line voltages. In some memory systems, the IR drop for the bit line voltages can be different during program-verify than during reading, and this difference in IR drop can lead to errors when reading. Therefore, to maintain accuracy when reading data, it is proposed to adjust bit line voltage during program-verify to compensate for different IR drops between program-verify and reading.

One embodiment uses a non-volatile storage apparatus for performing in-memory vector-matrix multiplication and comprises a plurality of non-volatile memory cells, a bit line connected the plurality of non-volatile memory cells, and a control circuit connected to the plurality of non-volatile memory cells and first bit line. The control circuit is configured to program the plurality of memory cells. The programming includes performing program-verify for the plurality of memory cells. The performing program-verify comprises adjusting the bit line voltage during program-verify to compensate for different IR drops between program-verify and reading. More details are provided below.

Figure 1:
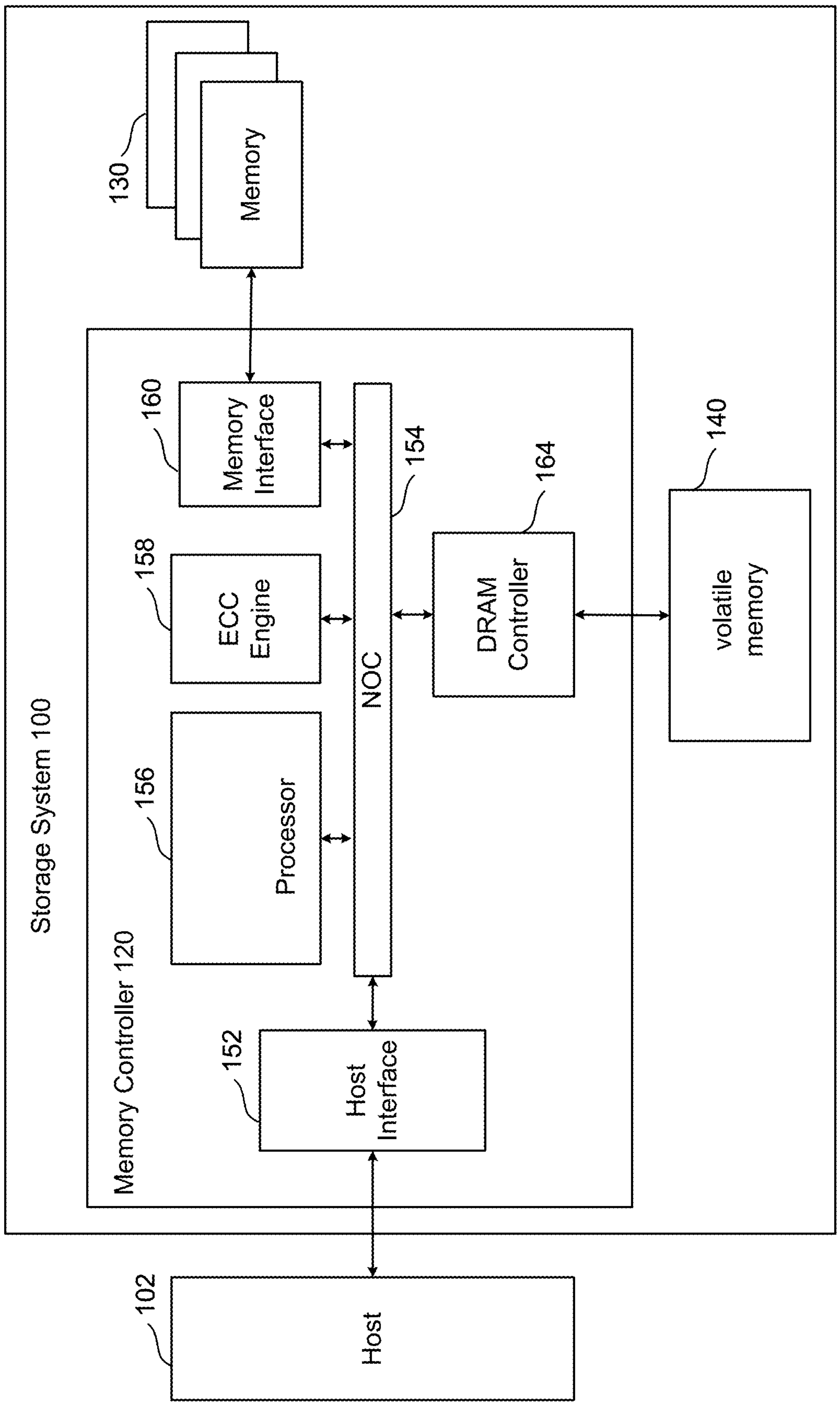
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
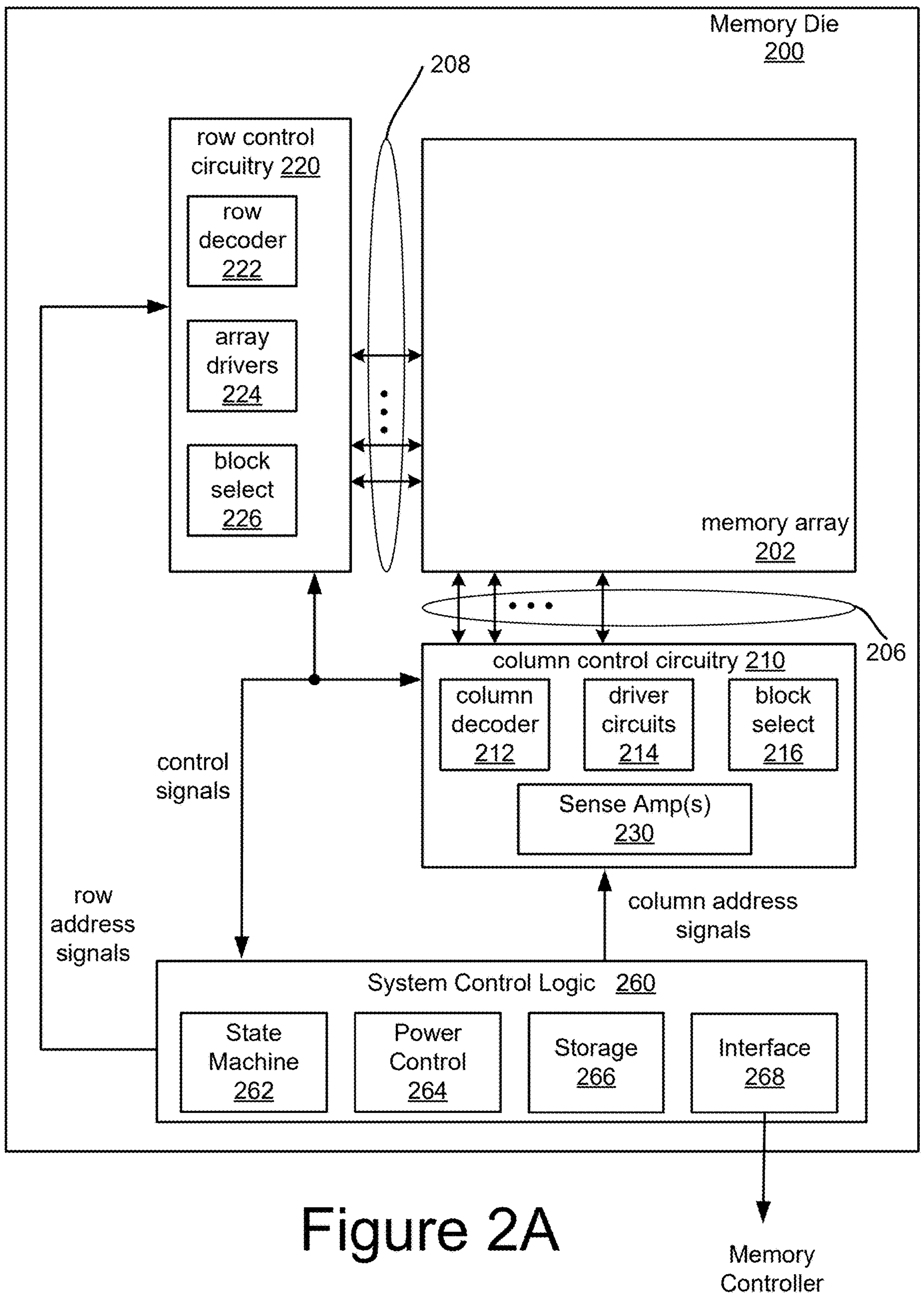
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for memory array 202, a memory die 200 can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuits for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
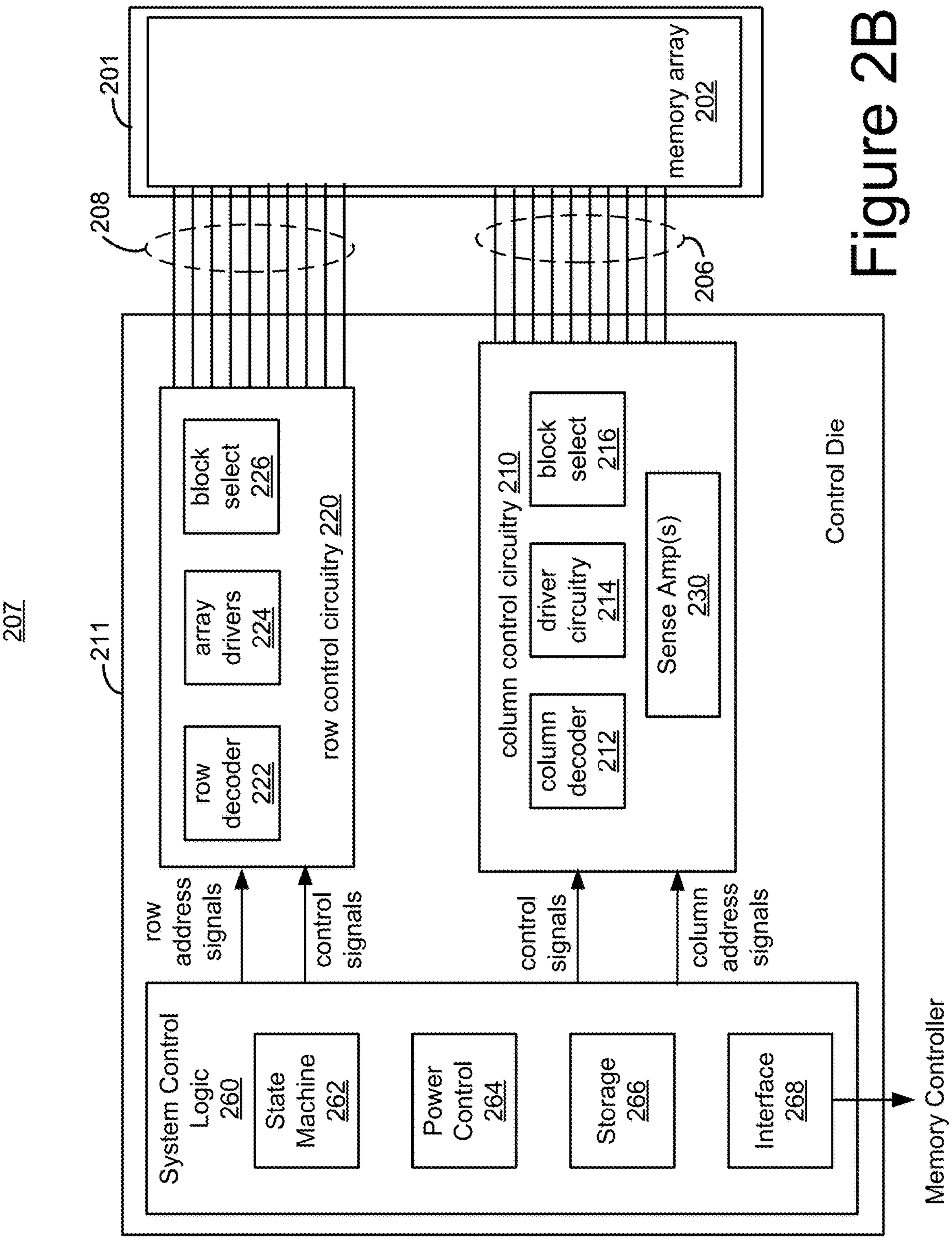
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
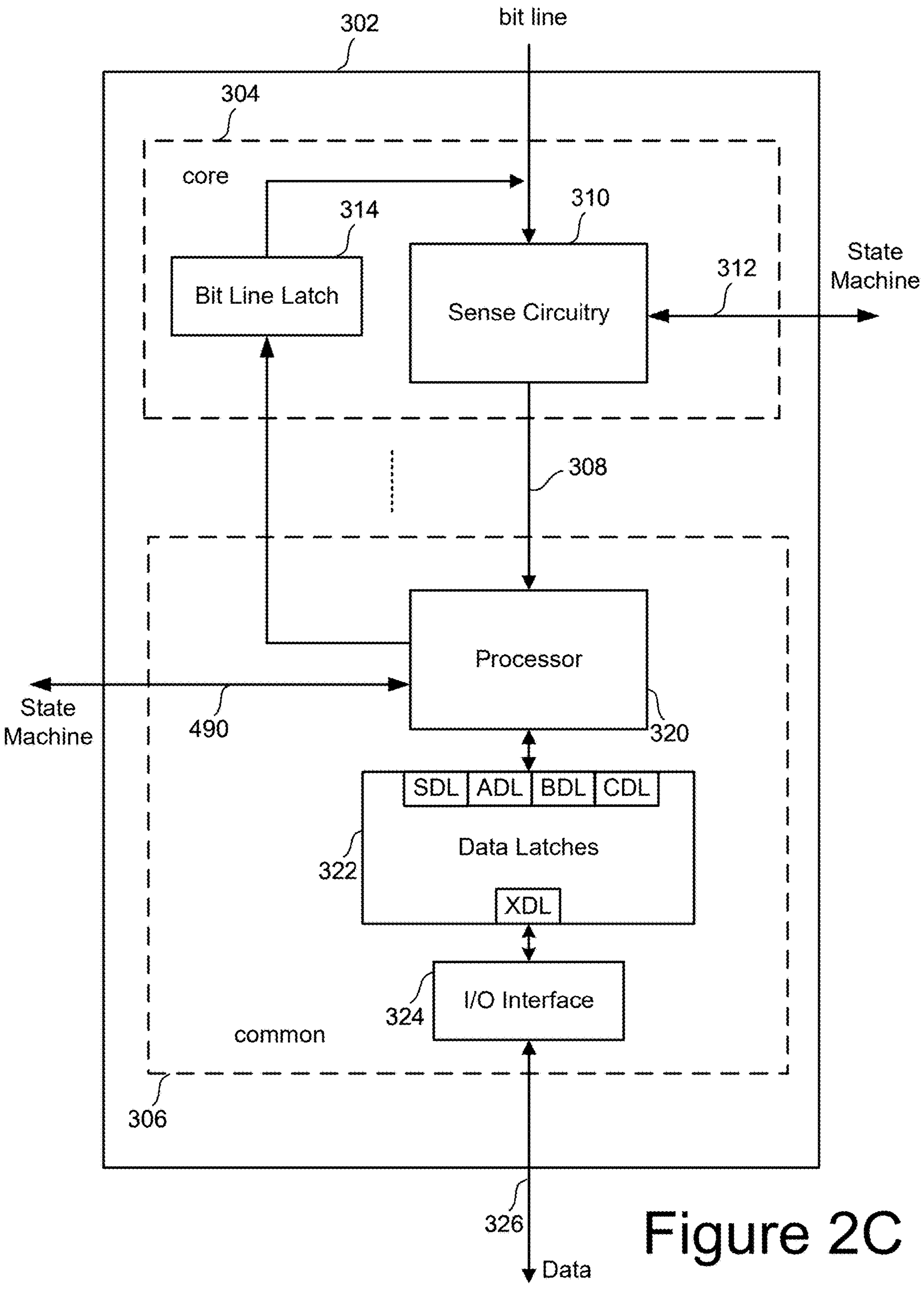
FIG. 2C depicts details of an individual sense block.

FIG. 2C is a block diagram depicting an individual sense block 302 of sense amplifiers 230 partitioned into a core portion 304 (referred to as a sense module 304) and a common portion 306. In one embodiment, there will be a separate sense module 304 for each bit line and one common portion 306 for a set of multiple sense modules 304. In one example, a sense block 302 will include one common portion 306 connected to eight, twelve, or sixteen sense modules 304. Each of the sense modules 304 in a group will communicate with the associated common portion 306 via a data bus 308. In one embodiment, sense amplifiers 230 will include many sense blocks 302.

Sense module 304 comprises sense circuitry 310 that determines whether a conduction current in a connected bit line is above or below a predetermined level or, in voltage based sensing, whether a voltage level in a connected bit line is above or below a predetermined level. The sense circuitry 310 is to receive control signals from the state machine via input lines 312. In some embodiments, sense circuitry 310 includes a circuit commonly referred to as a sense amplifier. Sense module 304 also includes a bit line latch 314 that is used to set a voltage condition on the connected bit line. For example, a predetermined state latched in bit line latch 314 will result in the connected bit line being pulled to a state designating program inhibit (e.g., VDD).

Common portion 306 comprises a processor 320, data latches 322 and an I/O Interface 324 coupled between the set of data latches 322 and data bus 326. Processor 320 performs computations. For example, one of its functions is to determine the data stored in the sensed memory cell and store the determined data in the set of data latches. The set of data latches 322 is used to store data bits determined by processor 320 during a read operation. It is also used to store data bits imported from the data bus 326 during a program operation. The imported data bits represent write data meant to be programmed into the memory. I/O interface 324 provides an interface between data latches 322 and the data bus 326.

During read or sensing, the operation of the system is under the control of state machine 262 that controls (using power control 264) the supply of different control gate or other bias voltages to the addressed memory cell(s). As it steps through the various predefined control gate voltages corresponding to the various memory states supported by the memory, the sense module 304 may trip at one of these voltages and an output will be provided from sense module 304 to processor 320 via bus 308. At that point, processor 320 determines the resultant memory state by consideration of the tripping event(s) of the sense module 304 and the information about the applied control gate voltage from the state machine via signal lines 490. It then computes a binary encoding for the memory state and stores the resultant data bits into data latches 322. In another embodiment, bit line latch 314 serves double duty, both as a latch for latching the output of the sense module 304 and also as a bit line latch as described above.

Data latch stack 322 contains a stack of data latches corresponding to an associated sense module 304. In one embodiment, there are three, four or another number of data latches per sense module 304. In one embodiment, the latches are each one bit (e.g., one bit per sense module 304). In one embodiment, the latches for each sense module 304 will be referred to as SDL, XDL, ADL, BDL, and CDL. Thus, in one embodiment, each sense module 304 has its own set of SDL, XDL, ADL, BDL, and CDL. In the embodiments discussed here, the latch XDL is a transfer latch used to exchange data with the I/O interface 324. In addition to a first sense amplifier data latch SDL, the additional latches ADL, BDL and CDL can be used to hold data.

During program or verify, the data to be programmed is stored in the set of data latches 322 from the data bus 326. During the verify process, processor 320 monitors the verified memory state relative to the desired memory state. When the two are in agreement, processor 320 sets the bit line latch 314 so as to cause the bit line to be pulled to a state designating program inhibit. This inhibits the memory cell coupled to the bit line from further programming even if it is subjected to programming pulses on its control gate. In other embodiments the processor initially loads the bit line latch 314 and the sense circuitry sets it to an inhibit value during the verify process.

In some implementations (but not required), the data latches are implemented as a shift register so that the parallel data stored therein is converted to serial data for data bus 326, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
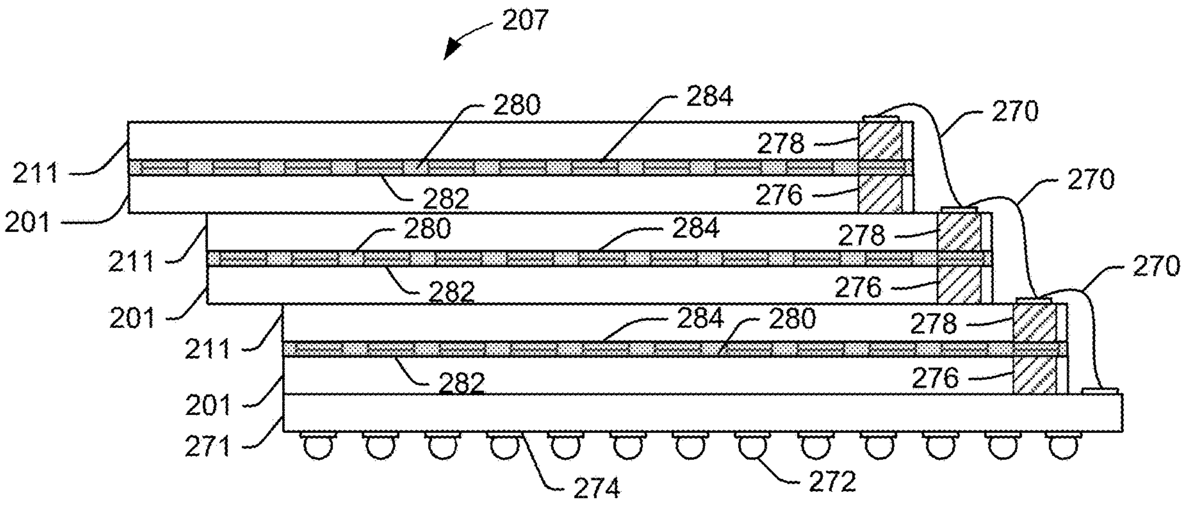
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
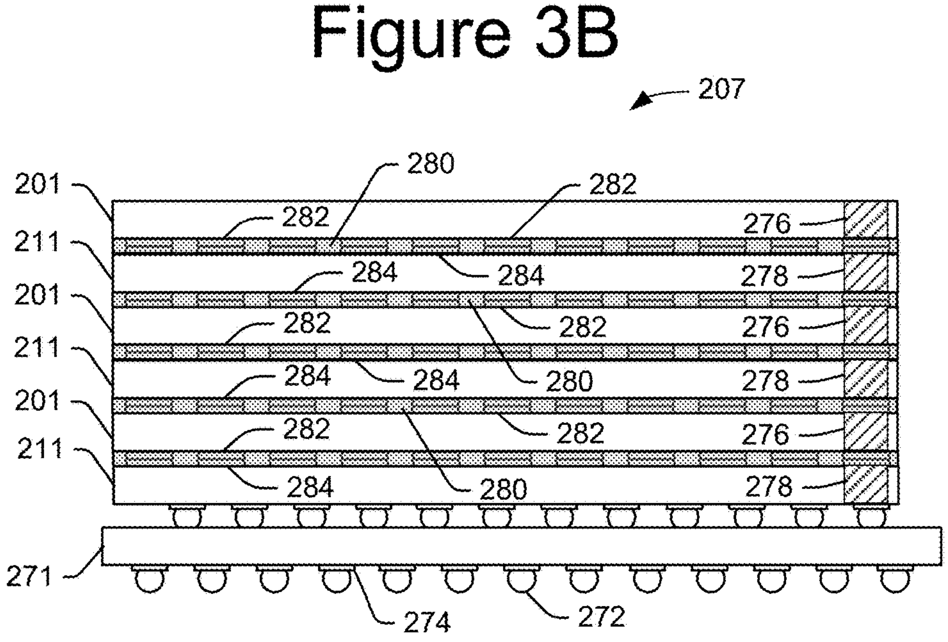

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
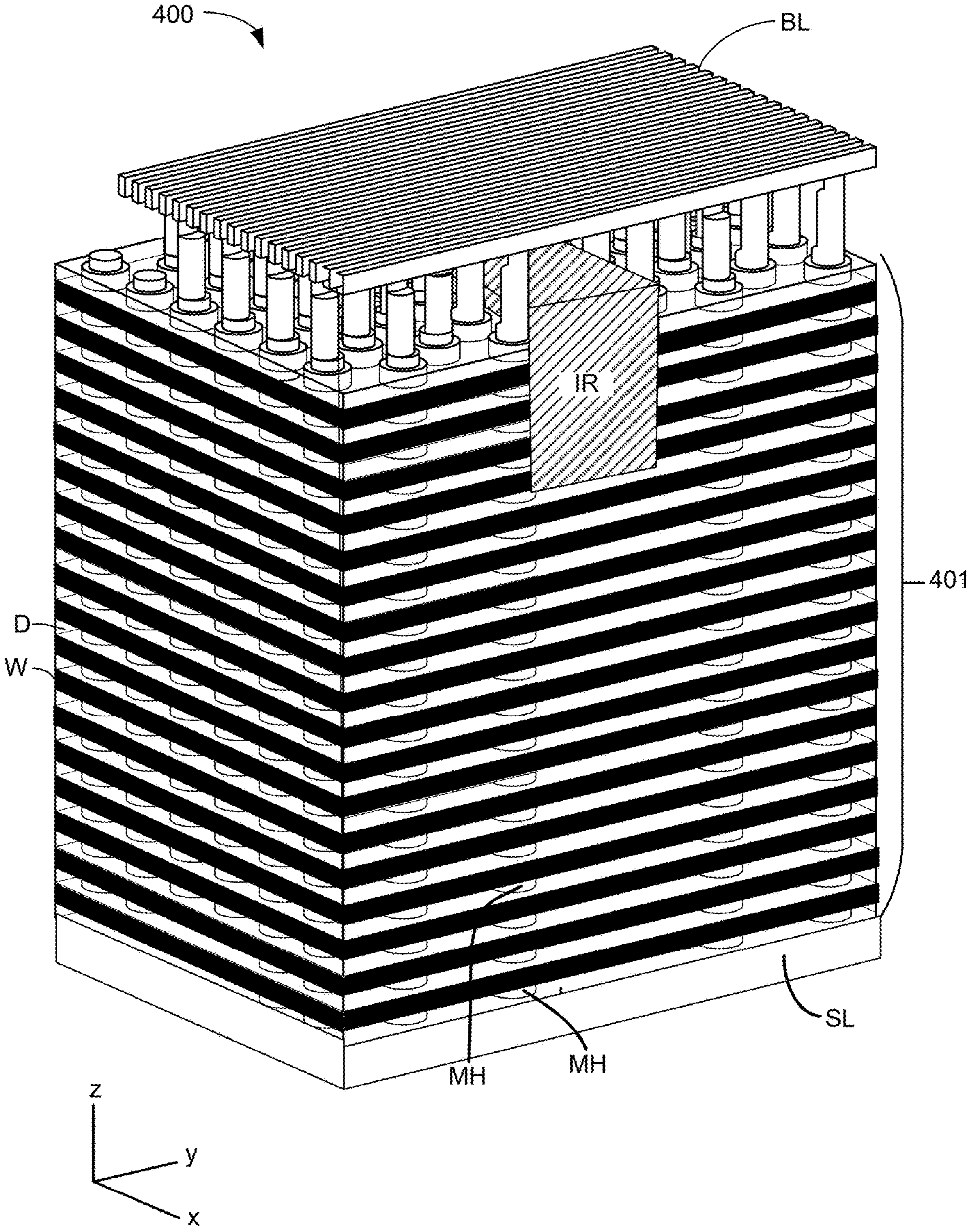
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
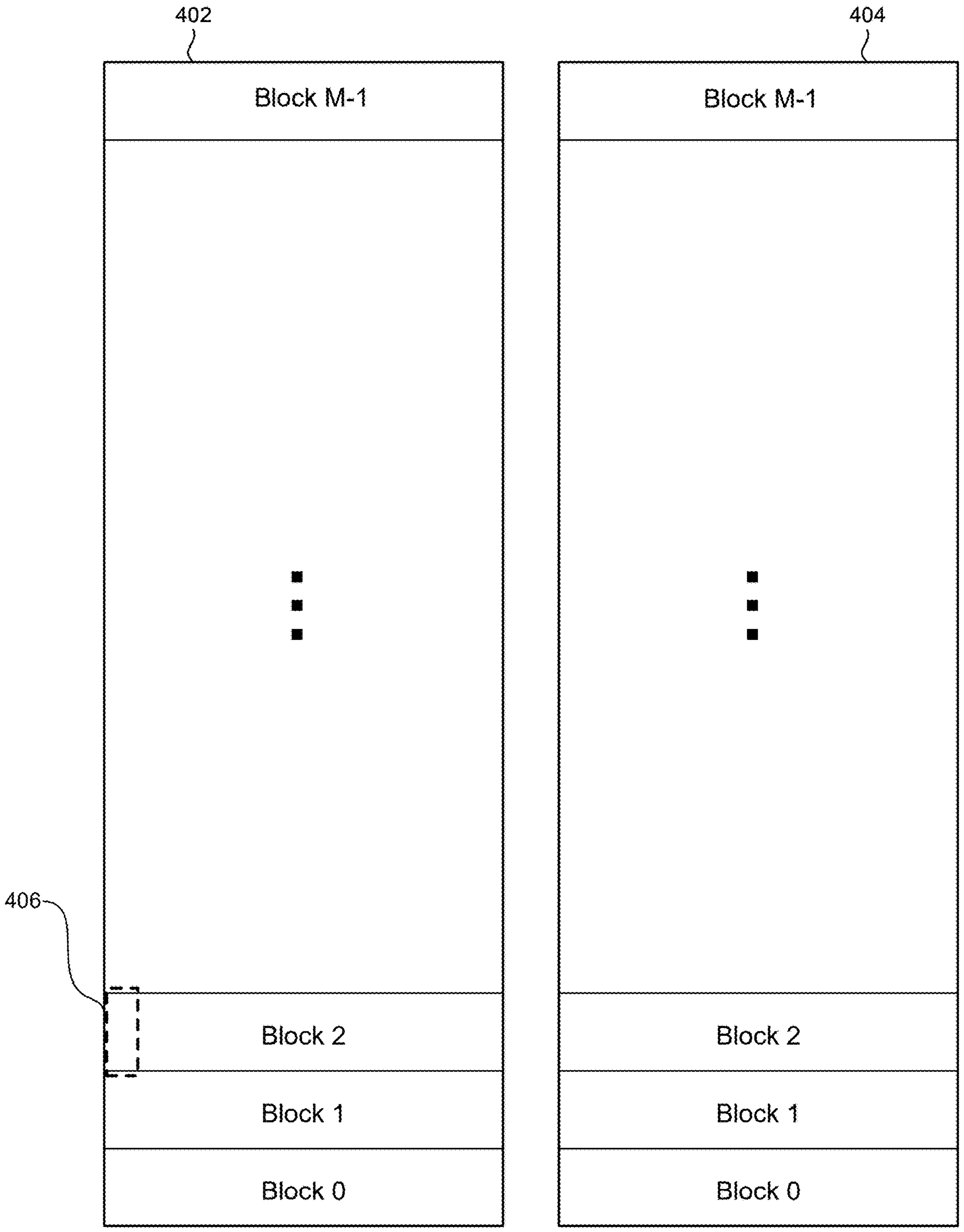
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
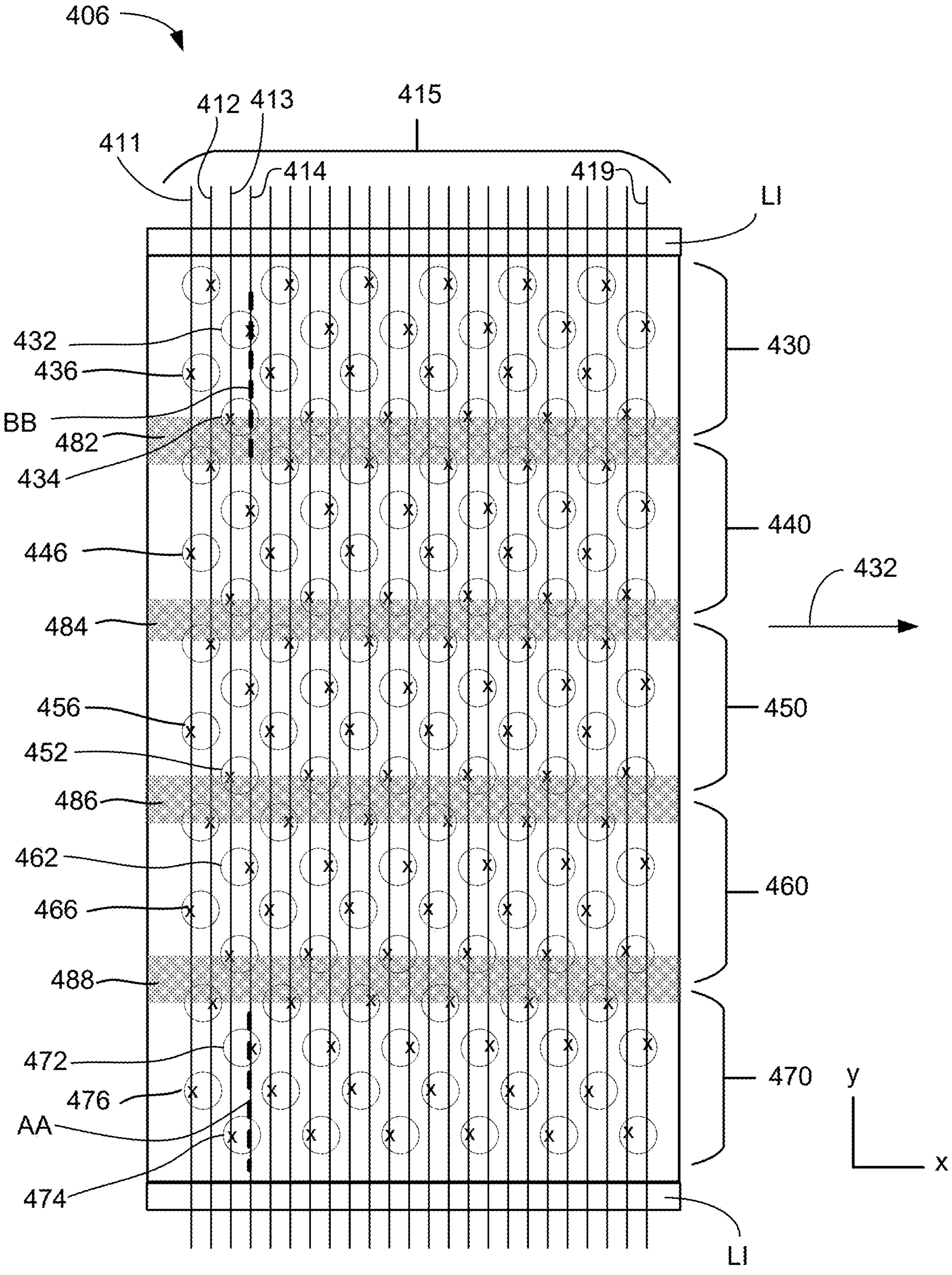
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$;

however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side select lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
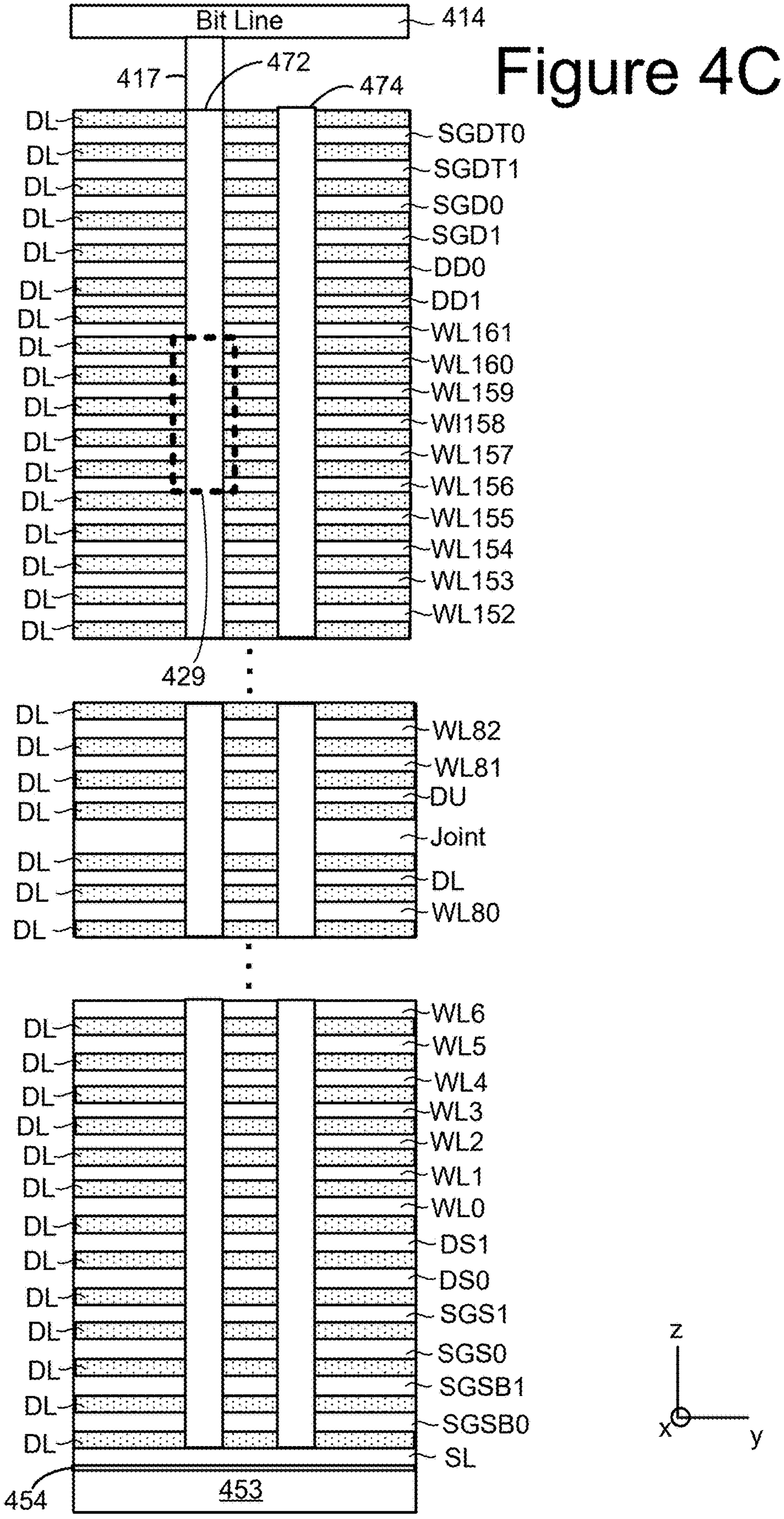
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
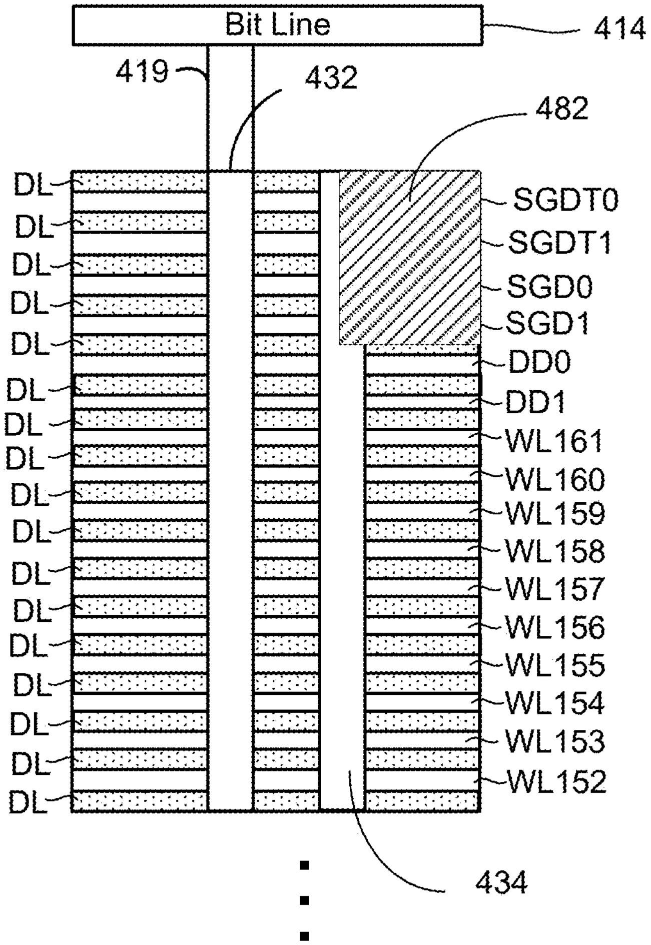
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross-sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND strings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
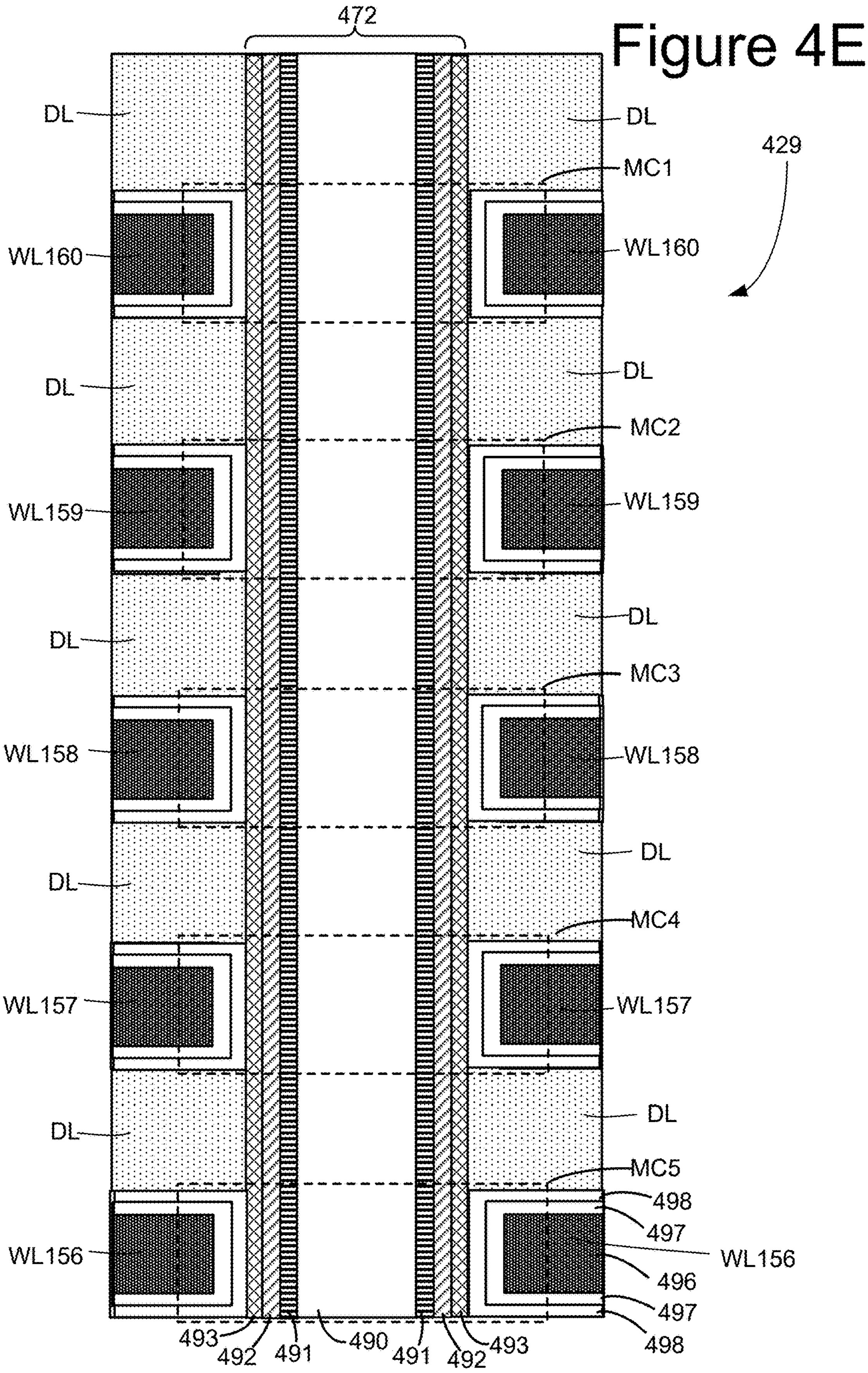
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
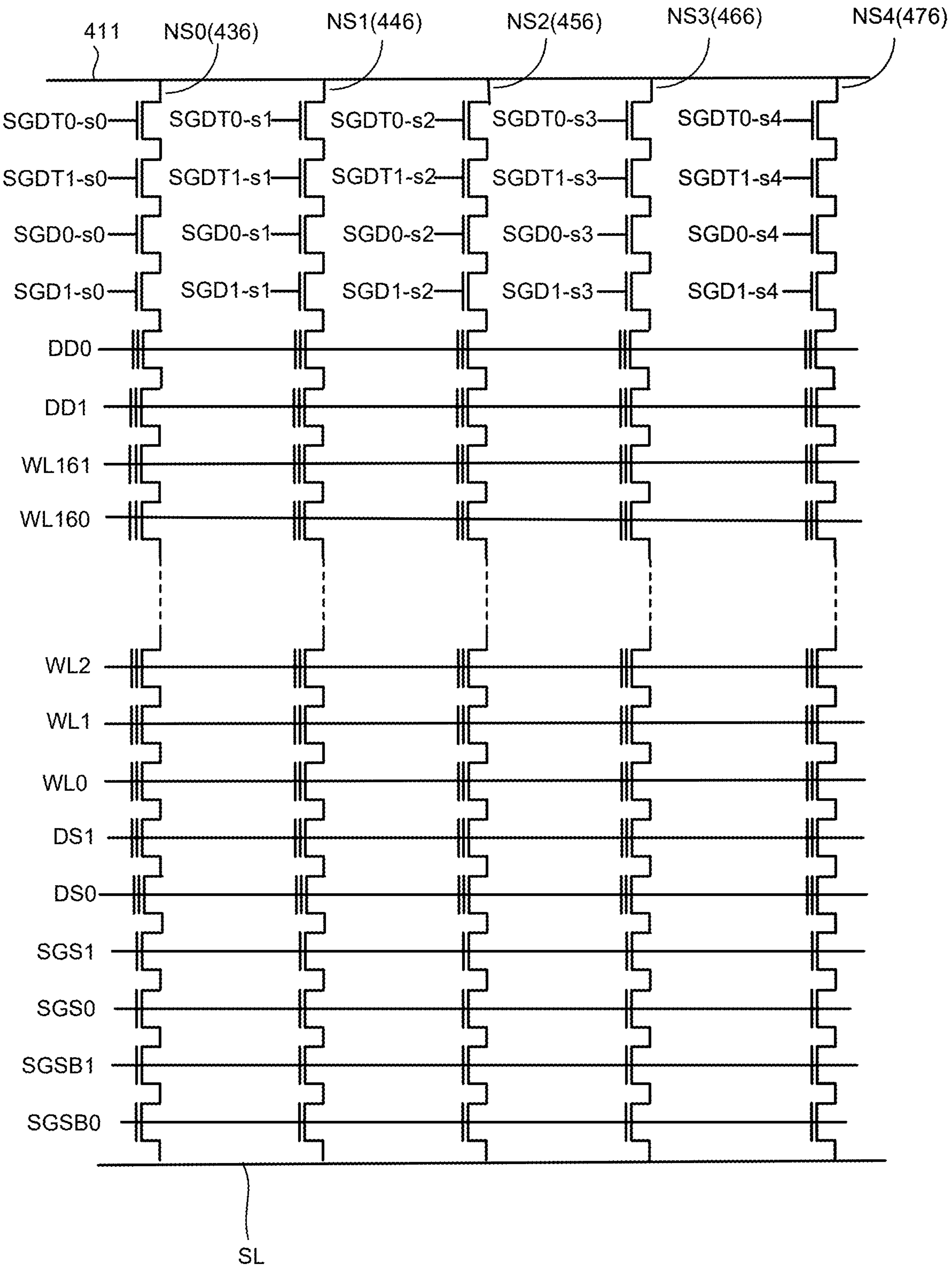
FIG. 4F is a schematic of a plurality of NAND strings in multiple regions of a same block.

FIG. 4F is a schematic diagram of a portion of the three-dimensional memory array 202 depicted in in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions 482, 484, 486 and 488 to form SGD0-*s*0, SGD0-*s*1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D)

memory structures can also be used with the technology described herein. The memory systems discussed above can be erased, programmed and read.

The memory structures described above can be used with artificial intelligence and machine learning applications.

Figure 5B:
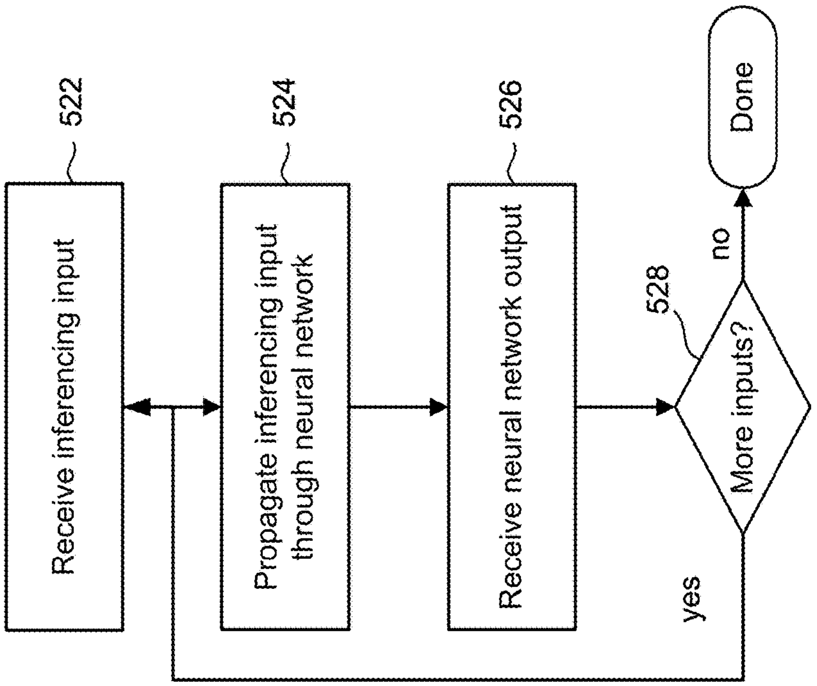
FIG. 5B is a flow chart describing one embodiment of a process for using a model with an inference engine.
Figure 5A:
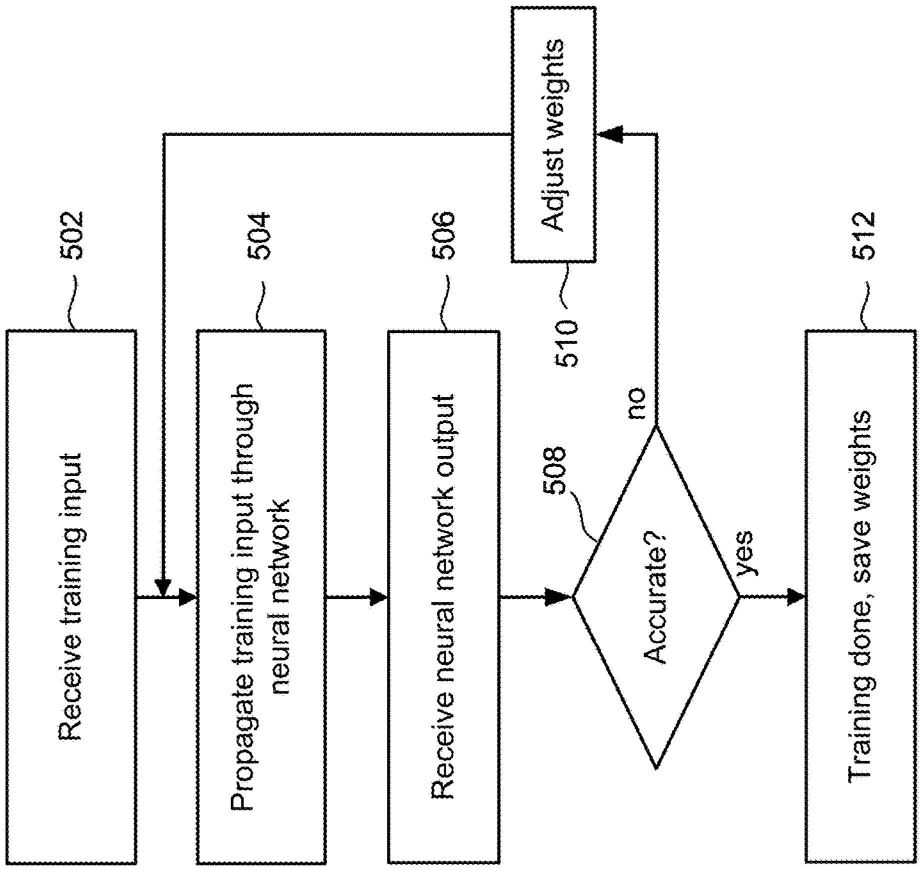
FIG. 5A is a flow chart describing one embodiment of a process for training a model.

Artificial neural networks are finding increasing usage in artificial intelligence and machine learning applications. In an artificial neural network, a set of inputs is propagated through one or more intermediate, or hidden, layers to generate an output. The layers connecting the input to the output are connected by one or more sets of weights that are generated in a training or learning phase by determining a set of a mathematical manipulations to turn the input into the output, moving through the layers calculating the probability of each output. Once the weights are established, they can be used in the inference phase to determine the output from a set of inputs. The set of weights can be referred to as a model. The determining of the weights is referred to as training the model. FIG. 5A is a flow chart describing one embodiment of a process for training a model. The use of the weights with real data is referred to as the inference phrase and is performed by using the neural network as an inference engine. FIG. 5B is a flow chart describing one embodiment of a process for using a trained model with the neural network as an inference engine.

An artificial neural network is "trained" by supplying inputs and then checking and correcting the outputs. For example, a neural network that is trained to recognize dog breeds will process a set of images and calculate the probability that the dog in an image is a certain breed. During training, a user can review the results and return the proposed label. Each mathematical manipulation when determining an answer is considered a layer, and complex neural networks have many layers. Due to the depth provided by a large number of intermediate or hidden layers, neural networks can model complex non-linear relationships as they are trained.

FIG. 5A is a flowchart describing one embodiment of a process for training a model to generate a set of weights. The training process is often performed in the cloud, allowing additional or more powerful processing engines to be accessed. At step 502, the input, such as a set of images, is received. At step 504 the input is propagated through the layers of the neural network using the set of weights. The neural network's output is then received at the output in step 506. In one example of a neural network designed to recognize dog breeds, the input would be the image data of a number of dogs, and the one or more intermediate layers use the current weight values to calculate the probability that the dog in an image is a certain breed, with the proposed dog breed label returned at step 506. A user can then review the results at step 508 to select which probabilities the neural network should return and decide whether the current set of weights supply a sufficiently accurate labelling and, if so, the training is complete (step 512). If the result is not sufficiently accurate, the neural network adjusts the weights at step 510 based on the probabilities the user selected, followed by looping back to step 504 to run the input data again with the adjusted weights. Once the neural network's set of weights have been determined, they can be used to "inference," which is the process of using the determined weights to generate an output result from data input into the neural network. Once the weights are determined at step 512, they can then be stored in non-volatile memory for later use, where the storage of these weights in non-volatile memory is discussed in further detail below.

FIG. 5B is a flowchart describing a process for the inference phase to predict a result from the input data. At step 522, the input is received, such as the image of a dog in the example used above. At step 524, the input data is then propagated through the neural network's one or more layers using the weights established at the end of the training process at step 512. After propagating the input through the layers, the output is then provided at step 526. If there are more inputs to process (step 528), then the method loops back to step 522; otherwise, the inferencing is completed.

Figure 5C:
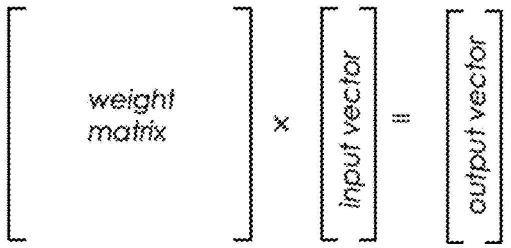
FIG. 5C depicts vector-matrix multiplication.

A basic operation used in artificial intelligence and machine learning applications (e.g., used by the neural network as an inference engine) is vector-matrix multiplication (VMM), which comprises multiplying an input vector by a weight matrix, resulting in an output vector, as depicted in FIG. 5C. VMM is used at each layer of a neural network.

Although neural networks can provide highly accurate results, they are extremely computationally intensive, require the storage of an enormous amount of data (e.g., the weights) and the data transfers involved in reading the weights from memory into the processors can be time intensive. For example, an artificial intelligence/machine learning application may need to store 175 billion weights. Prior systems store weights in DRAM, which is very expensive. When needed, the weights are transferred to a GPU, which wastes time. To overcome both of these issues, it is proposed to store the weights in non-volatile memory, such as the NAND memory discussed above with respect to FIGS. 4-4F. Such NAND memory is significantly less expensive than DRAM. Furthermore, the non-volatile memory can be configured to perform the vector-matrix multiplication in-memory using the weights stored in the non-volatile memory as part of the inference phase, thereby, removing the need to transfer the weights to an external processor that is implementing the inference engine. Thus, using the non-volatile memory to store the weights and preform the vector-matrix multiplication increases performance (e.g., not wasting time on large data transfers) and reduces cost (NAND is cheaper than DRAM).

FIG. 6 is a perspective view of a portion of one embodiment of the monolithic three dimensional memory structure of FIGS. 4-4F configured to perform vector-matrix multiplication. The memory structure includes many memory holes/vertical columns implementing NAND strings. The NAND strings comprise non-volatile memory cells and select gates, as discussed above. The NAND strings are grouped into a plurality of blocks (see e.g., FIG. 4A). The portion of the memory depicted in FIG. 6 includes bit lines 610 connected to the top of the NAND strings, a drain side select line 612 (e.g., any of SGD0 or SGD1) connected to drain side select gates of the NAND strings, source side select lines 614 and 616 (e.g., SGS1 and SGS0) connected to source side select gates of the NAND strings and data word lines 618, 620, 622 and 624 (e.g., any of WL0-WL161) connected to the memory cells of the NAND strings. Each of the bit lines 610 are connected to NAND strings in every block of the plurality of blocks (e.g., connected to Block 0-Block M−1 of FIG. 4A). In one embodiment, each bit line is connected to one NAND string in every region (e.g., of regions 430, 440, 450, 460 and 470 of FIG. 4B) of every block of a plane. FIG. 6 is simplified to only show a subset of the data word lines, bit lines and select lines in order to make the drawing easier to read; however, the memory of FIG. 6 will include all of the structures depicted in FIGS. 4B-4E (including all of the word lines and select lines describe above). Each of the memory cells stores weight information (which can be a weight or information from which the weight can be derived). The weights are stored in the memory cells as part of step 512 of FIG. 5A.

To perform vector-matrix multiplication in and by the non-volatile memory, using the weights stored in the memory cells of the non-volatile memory, the control circuit applies read enable voltages to the word lines (e.g., applies Veg to the word line 622 connected to the memory cells selected for sensing because they are storing the weights needed for the VMM and applies Vread [an overdrive voltage ~5-8 v] to word lines 618/620/624 that are not selected); applies an input vector to one or more select lines (e.g., select line 612) while applying the read enable voltages to the word lines, and senses an output vector from the bit lines 610 using the senses amplifiers (S/A) 230. The voltage Vcg is one example of a reference voltage, discussed below. The sensed output vector is a set of output currents sensed on bit lines 610. In one embodiment, each bit line is connected to one NAND string in every region of every block of a plane; therefore, the bit line can potentially receive current concurrently from multiple NAND strings (ie one NAND string in each region of each block of a plane). The current received at the bit line from the multiple NAND strings is added together such that the sense amplifier senses the sum of the current from the multiple NAND strings. This is described by the math of FIG. 7 which shows the total current sensed on bit line i, labeled as $I_i$, is the sum of the current $I_{i1}$ from a first NAND string, the current $I_{i2}$ from a second NAND string, . . . the current $I_{i20}$ from a twentieth NAND string, etc. FIG. 7 shows math for twenty NAND strings but in other embodiments, a bit line can be connected to and concurrently receiving current from hundreds or thousands of NAND strings. In one embodiment, there are 16K bit lines. The current from any given NAND string is the product of the weight stored in the selected memory cell in the NAND string and the magnitude at the relevant position of the input vector. For example, the current $I_{i1}$ from the first NAND string is $I_{i1}=w_{i,1}(x_1)$, where $w_{i,1}$ is the weight stored in the selected memory cell (connected to word line 622) on the first NAND string and $x_1$ is the magnitude of the signal on the SGD line 612 connected to the first NAND string. In one embodiment, the SGD line is either logic 1 (on) or logic 0 (off). FIG. 8 indicates that the output vector I includes each of the current magnitudes from the multiple bit lines 610, and represents the product the matrix of weights ($w_{x,y}$) and the input vector ($x_1$, $x_2$, . . . $x_N$).

Figure 9:
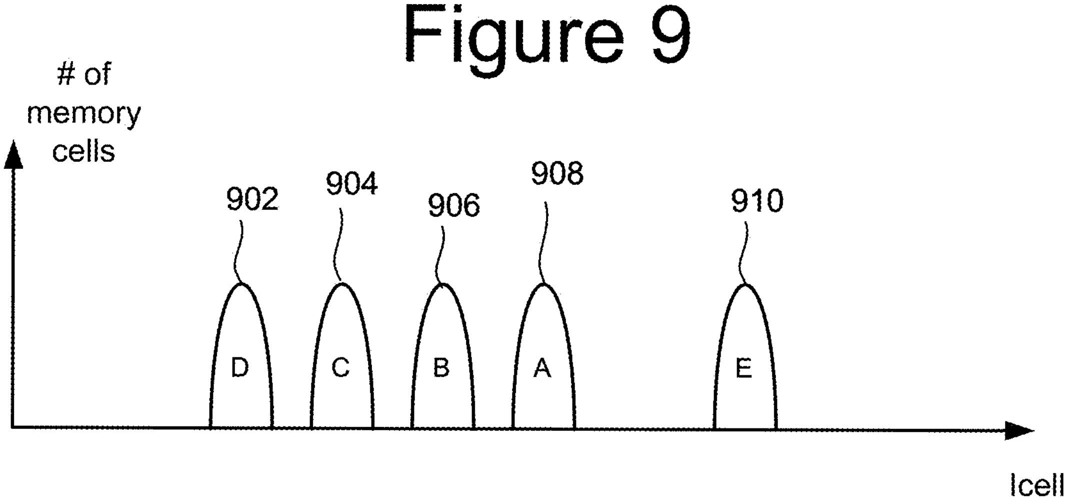
FIG. 9 depicts current distributions.

In one embodiment, the weights are stored in the memory cells as analog values representing current that will flow through the memory cells (e.g., between the source and drain) when applying a reference voltage to the gate (encoding weight information as memory cell current in the memory cells). In one example implementation, the memory cells can be programmed to store any current magnitude (e.g., an analog value or an integer). In another embodiment, the non-volatile memory cells are configured to be programmed into a set of data states defined by current distributions when applying a common voltage (e.g., Vcg) to the non-volatile memory cells. For example, FIG. 9 depicts current distributions 902, 904, 906, 908 and 910. Current distribution 910 represents erased memory cells (the erased state or unprogrammed state). From the erased state, memory cells can be programmed to current distribution 908 (representing data state A), current distribution 906 (representing data state B), current distribution 904 (representing data state C), and current distribution 902 (representing data state D). All of the memory cells in data state A are storing the same weight. That is, when applying a reference voltage (e.g., Vcg) to the gate of the memory cells, a current will flow between the source and the drain that has a magnitude in current distribution 908. All of the memory cells in data state B are storing the same weight such that when applying a reference voltage to the gate of the memory cells, a current will flow between the source and the drain that has a magnitude in current distribution 906. All of the memory cells in data state C are storing the same weight such that when applying a reference voltage to the gate of the memory cells, a current will flow between the source and the drain that has a magnitude in current distribution 904. All of the memory cells in data state D are storing the same weight such that when applying a reference voltage to the gate of the memory cells, a current will flow between the source and the drain that has a magnitude in current distribution 902. In one example embodiment, current distribution 908 is centered at 80 nA, current distribution 906 is centered at 60 nA, current distribution 904 is centered at 40 nA, and current distribution 902 is centered at 20 nA. In the embodiment of FIG. 9, memory cells can store four different magnitudes of weights. In other embodiments, memory cells can store more than four different magnitudes of weights by implementing more current distributions.

Figure 10:
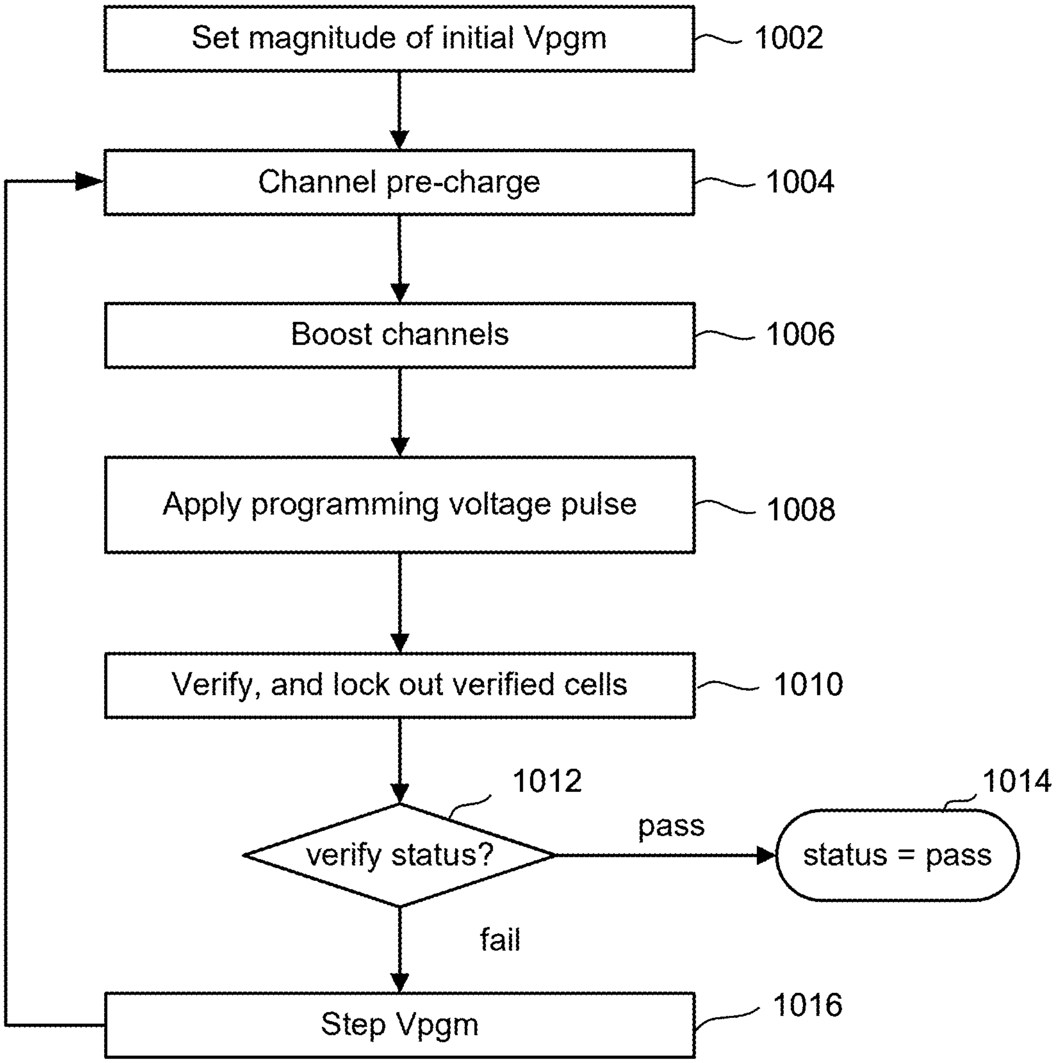
FIG. 10 is a flow chart describing one embodiment of a process for programming non-volatile memory.

FIG. 10 is a flow chart describing one embodiment of a process for programming weights into memory cells (encoding the weight information as memory cell current in the memory cells). The process of FIG. 10 can be performed as part of step 512 of FIG. 5A. In some example implementations, the process of FIG. 10 can be performed by any one of the one or more control circuits discussed above. The process of FIG. 10 can be performed entirely by a control circuit on memory die 200 (see FIG. 2A) or entirely by a control circuit on integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220. In another embodiment, the process of FIG. 10 is performed by memory controller 120 in combination with System Control Logic 260, Column Control Circuitry 210 and Row Control Circuitry 220. In some embodiments, the process of FIG. 10 is performed on any of the non-volatile memories discussed above.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 1002 of FIG. 10, the programming voltage signal (Vpgm) is initialized to the starting magnitude (e.g., ~12-16V or another suitable level). In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1004 the control circuit will pre-charge channels of NAND strings that include memory cells connected to the selected word line that are to be inhibited from programming. In step 1006, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND strings.

In step 1008, a program voltage pulse of the programming voltage signal Vpgm is applied to the selected word line (the word line selected for programming). If a memory cell on a NAND string should be programmed, then the corresponding bit line is biased at a program enable voltage. In step 1008, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1010, program-verify is performed, which includes testing whether memory cells being programmed have successfully reached their target data state. Memory cells that have reached their target states are locked out from further programming by the control circuit. Step 1010 includes performing verification of programming by applying a reference voltage to the selected word line (which is connected to the gates of the selected memory cells) and sensing the current flowing in the NAND strings. In one embodiment, the sense amplifiers are designed to sense for the current magnitudes at the center (or edge) of each of the current distributions 902-910. In one embodiment, the verification process is performed by testing whether the current flowing through the memory cells selected for programming have reached the appropriate magnitude. In step 1010, a memory cell may be locked out after the memory cell has been successfully verified that the memory cell has reached its target data state.

If all memory cells have successfully verified (step 1012), then the programming process has completed successfully. In one embodiment, the programming process is completed successfully when a sufficient number of memory cells (but not all) have successfully verified, where an example of a sufficient number of memory cells is a number less than the number of bits than can be corrected by error correction techniques. If all memory cells have not yet successfully verified or a sufficient number of memory cells have not yet successfully verified (step 1012), then the programming voltage signal Vpgm (applied to the selected word line) is stepped up to the next magnitude and the process continues at step 1004 to apply the next programming pulse. For example, the next pulse will have a magnitude greater than the previous pulse by a step size ΔVpgm (e.g., a step size of 0.1-1.0 volts).

In one embodiment memory cells are erased prior to programming. Erasing is the process of changing the threshold voltage of one or more memory cells so that they will conduct current in data state E (current distribution 910) in response to the reference voltage. In some embodiments, a memory cell in data state E is said to be erased, in the erased condition or in the unprogrammed condition. In some embodiments, being in an unprogrammed condition means to be in a condition such that the memory cell is outside of the window of valid data states, such as (for example) having a memory cell current greater than the memory cells currents associated with data state A (with an optional margin) and less than the memory cells currents associated with data state D (with an optional margin).

At the end of the programming process of FIG. 10, the memory cells will be in the current distributions of FIG. 9. In an ideal world, memory cells programmed to 40 nA would conduct exactly 40 nA in response to the reference voltage. However, due to the variance in real world physical devices a population of memory cells programmed to 40 nA will conduct 40 nA+/−Δ in response to the reference voltage. This Δ is what causes the memory cells to be in a current distribution (rather than a spike on the graph). However, to minimize errors and maximize accuracy of the inferencing, it is desirable that the current distributions 902-908 of FIG. 9 be narrow.

As discussed above, one set of embodiments of the non-volatile storage apparatus described herein performs in-memory vector-matrix multiplication. One of the unique features of some embodiments of in-memory vector-matrix multiplication is the multi-block concurrent sensing, which allows for the performance of multiplication and addition inside the non-volatile memory structure 202. However, such in-memory vector-matrix multiplication also introduces an issue for sensing. Both program-verify and reading include sensing memory cells, and the sensing includes applying appropriate bit line voltages. In some memory systems, the IR drop for the bit line voltages can be different during program-verify than during reading, and this difference in IR drop can lead to inaccuracies when reading. This is explained in more detail with respect to FIGS. 11A and 11B.

FIG. 11A shows a plurality of NAND strings 1104, 1106, 1108, . . . 1110, 1112 and 1114. Each of NAND strings 1104-1114 include a set of non-volatile memory cells for storing data, select gates, etc., as discussed above with respect to FIGS. 4-4F. Each of NAND strings 1104-1114 are connected to bit line 1102 (i.e., the common bit line). Each of NAND strings 1104-1114 is connected to a different set of select lines; for example, NAND string 1104 is connected to select line $SGD_0$, NAND string 1106 is connected to select line $SGD_1$, NAND string 1108 is connected to select line $SGD_2$, NAND string 1110 is connected to select line $SGD_{N-2}$, NAND string 1112 is connected to select line $SGD_{N-1}$, and NAND string 1114 is connected to select line $SGD_N$. Although FIG. 11 only shows one select line connected to each NAND string for purposes of simplifying the drawing, it is contemplated that in many embodiments the NAND strings will have more than one select line (e.g., as depicted in FIG. 4C).

In one embodiment, each of NAND strings 1104-1114 are in different regions (see regions 430-470 of FIG. 4B) such that each region has its own set of one or more select lines. In an embodiment that implements five regions per block (e.g., as depicted in FIG. 4B), the bit line will connect to five NAND strings in each block as (in some embodiments) the bit line connects to one NAND string in each region of every block of a plane. In another embodiment, each of NAND strings 1104-1114 are in different blocks of a same plane.

Step 1010 of FIG. 10 (the programming process) includes performing program-verify, which comprises one or more sensing operation to confirm whether one or more memory cells have successfully reached their programming target. In one embodiment, performing program-verify includes sensing from one NAND at a time, with respect to the NAND strings connected to a common bit line. FIG. 11A depicts the example of performing program-verify for NAND string 1114 (which can be in block N or region N). To perform program-verify, a voltage $V_{BL}$ is applied to the bit line 1102, causing a current $I_N$ to flow through the bit line and NAND string 1114. FIG. 11A depicts the resistance R of each segment of the bit line 1102. Thus, the IR drop experienced by the voltage applied to bit line 1102 is equal to I×(N×R). As a result of the IR drop, VDs for a memory cell on NAND string 1114 is equal to $V_{DS}=V_{BL}-I\times(N\times R)$ during program-verify.

FIG. 11B shows the plurality of NAND strings 1104, 1106, 1108, . . . 1110, 1112 and 1114 during a read process, which (in some embodiments) comprises performing vector-matrix multiplication (see e.g., FIGS. 6-8) and includes concurrently receiving current on the bit line from all of the NAND strings 1104-1114 (e.g., receiving on a common bit line and adding together current from one NAND string in each region of each block of a plane). Therefore, FIG. 11B depicts each of NAND strings 1104-1114 receiving current from applying voltage $V_{BL}$ to the bit line 1102. As a result, the total IR drop experienced by the voltage applied to bit line 1102 during a read operation is equal to I×(1+N) N/2×R. Because of this IR drop, $V_{DS}$ for NAND string 1114 is equal to $V_{DS}=V_{BL}-I\times(1+N)N/2\times R$ during a read operation. Therefore, $V_{DS}$ during a read operation is smaller than $V_{DS}$ during a program-verify operation (causing smaller current during read). Given the program-verify versus read bit line voltage mismatch, target memory cell current (or equivalent threshold voltage) during read will be smaller than program-verified memory cell current (or threshold voltage is higher). This difference can lead to an inaccuracy during the read process (inaccuracies for the vector-matrix multiplication that is part of the inferencing, so inaccuracies for the inferencing).

To remedy the above-described problem of the mismatch between program-verify and read, it is proposed to adjust bit line voltage during program-verify to compensate for different IR drops between program-verify and reading. For example, the system can use a lower bit line voltage during program-verify than during read operations. In some embodiments, the system implements location specific bit line voltages during program-verify such that memory cells in locations (e.g., blocks or regions) farther from the bit line drivers are intentionally programmed to a higher memory cell current than memory cells positioned in locations closer to the bit line drivers by using smaller bit line voltages during program-verify for memory cells positioned in location farther from the bit line drivers than bit line voltages used during program-verify for memory cells positioned in locations closer to the bit line drivers. By using these techniques, the memory can pre-compensate multi-block read induced current lowering during program-verify, thus providing that current in each block/region during reading (e.g., VMM) is accurate.

FIG. 12 is a flow chart of one embodiment of a process for adjusting bit line voltage during program-verify to compensate for different IR drops between program-verify and reading. In some example implementations, the process of FIG. 12 can be performed by any one of the one or more control circuits discussed above. The process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260, Column Control Circuitry 210 and Row Control Circuitry 220. In another embodiment, the process of FIG. 12 is performed by memory controller 120 in combination with System Control Logic 260, Column Control Circuitry 210 and Row Control Circuitry 220. In some embodiments, the process of FIG. 12 is performed on any of the non-volatile memories discussed above.

In step 1202 of FIG. 12, the control circuit applies a first bit line voltage to the bit line during program-verify for a memory cell connected to that bit line. In one example, the memory cell is part of a NAND string connected to the bit line. In one embodiment, step 1202 is performed as part of the program-verify process of step 1010. In step 1204, the control circuit applies a second bit line voltage to the bit line during a read process for the memory cell. In one embodiment, step 1204 is performed as part of a read operation (e.g., the VMM of FIG. 5B). The first bit line voltage applied during program-verify is lower in voltage magnitude than the second bit line voltage applied during the read process.

FIG. 13 is a flow chart of one embodiment of a process for adjusting bit line voltage during program-verify to compensate for different IR drops between program-verify and reading. The process of FIG. 13 is an example implementation of the process of FIG. 12. In some example implementations, the process of FIG. 13 can be performed by any one of the one or more control circuits discussed above. The process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220. In another embodiment, the process of FIG. 13 is performed by memory controller 120 in combination with System Control Logic 260, Column Control Circuitry 210 and Row Control Circuitry 220. In some embodiments, the process of FIG. 13 is performed on any of the non-volatile memories discussed above.

In step 1302 of FIG. 13, the control circuit programs a plurality of memory cells (e.g., see FIGS. 5A and 10). The programming includes performing program-verify (e.g., step 1010) for the plurality of memory cells. Performing program-verify comprises applying location dependent bit line voltages to a first bit line connected to the plurality of memory cells. The location dependent bit line voltages are different in voltage magnitude for different locations of the memory cells based on distance from a first bit line driver connected to the first bit line. The different locations can include different regions, different blocks or other partitions. In step 1304, the control circuit reads the plurality of memory cells (e.g., the process of FIG. 5B) while applying a common bit line voltage to the first bit line. In one embodiment, the location dependent bit line voltages are all lower in voltage magnitude than the common bit line voltage to compensate for the above-described mismatch in IR drops (and current) between program-verify and read operations.

Figure 14A:
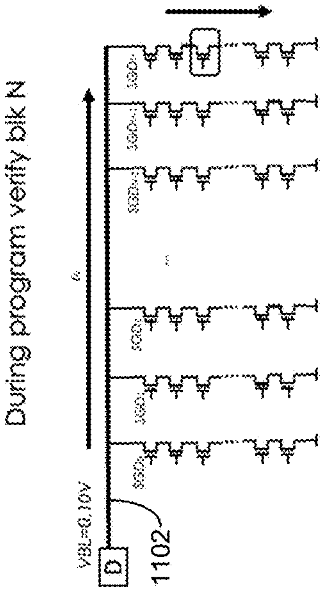
FIGS. 14A-F depicts voltage applied to NAND strings at different locations during program-verify.

FIGS. 14A-F depict the same bit line 1102 connected to the same NAND strings as FIGS. 11A and 11B, implementing step 1302 of FIG. 13. FIGS. 14A-F also show bit line 1102 connected a bit line driver D. FIG. 14A depicts performing verify for a NAND string in block N (blk N). As mentioned, in one embodiment program-verify is performed one NAND at a time (one NAND string connected to a common bit line). Block N (blk N) is the furthest block from the bit line driver, so the voltage applied to the bit line is the smallest as compared to other blocks. FIG. 14A shows the voltage (VBL) applied to the bit line as VBL=0.10 v.

Figure 14B:
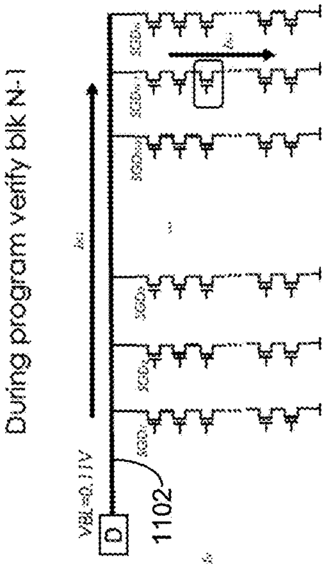

FIG. 14B depicts performing verify for a NAND string in block N−1 (blk N−1). Block N−1 (blk N−1) is the second furthest from the bit line driver, so the voltage applied to the bit line is the second smallest as compared to other blocks. FIG. 14B shows the voltage applied to the bit line as VBL=0.11 v.

Figure 14C:
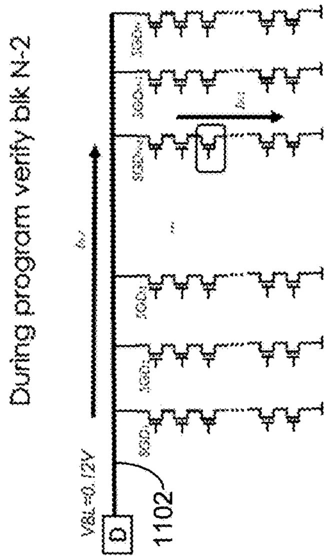

FIG. 14C depicts performing verify for a NAND string in block N−2 (blk N−2). Block N−2 (blk N−2) is the third furthest from the bit line driver, so the voltage applied to the bit line is the third smallest as compared to other blocks. FIG. 14C shows the voltage applied to the bit line as VBL=0.12 v.

Figure 14D:
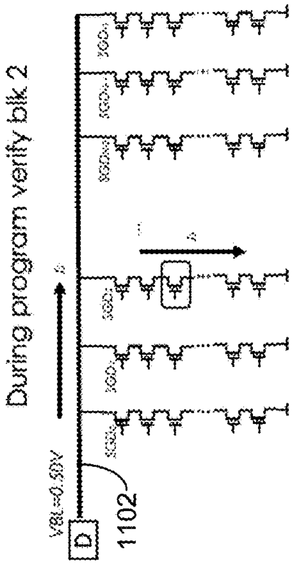

FIG. 14D depicts performing verify for a NAND string in block 2 (blk 2). Block 2 (blk 2) is the third closest to the bit line driver, so the voltage applied to the bit line is the third largest as compared to other blocks. FIG. 14D shows the voltage applied to the bit line as VBL=0.50 v. Note that it is contemplated that there are many blocks between Block 2 (bkl 2) and Block N−2 (blk N−2).

Figure 14E:
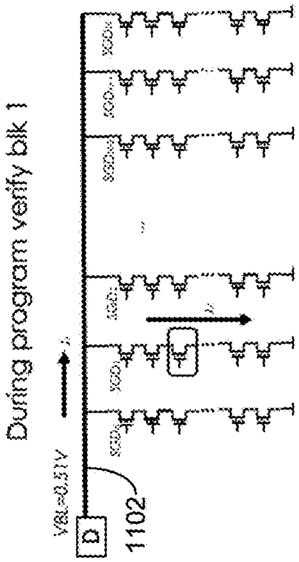

FIG. 14E depicts performing verify for a NAND string in block 1 (blk 1). Block 1 (blk 1) is the second closest to the bit line driver, so the voltage applied to the bit line is the second largest as compared to other blocks. FIG. 14E shows the voltage applied to the bit line as VBL=0.51 v.

Figure 14F:
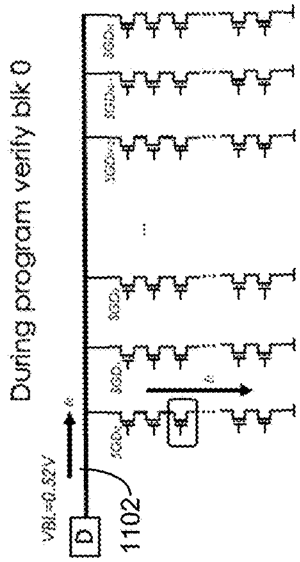

FIG. 14F depicts performing verify for a NAND string in block 0 (blk 0). Block 0 (blk 0) is the closest to the bit line driver, so the voltage applied to the bit line is the largest as compared to other blocks. FIG. 14F shows the voltage applied to the bit line as VBL=0.52 v.

Figure 15:
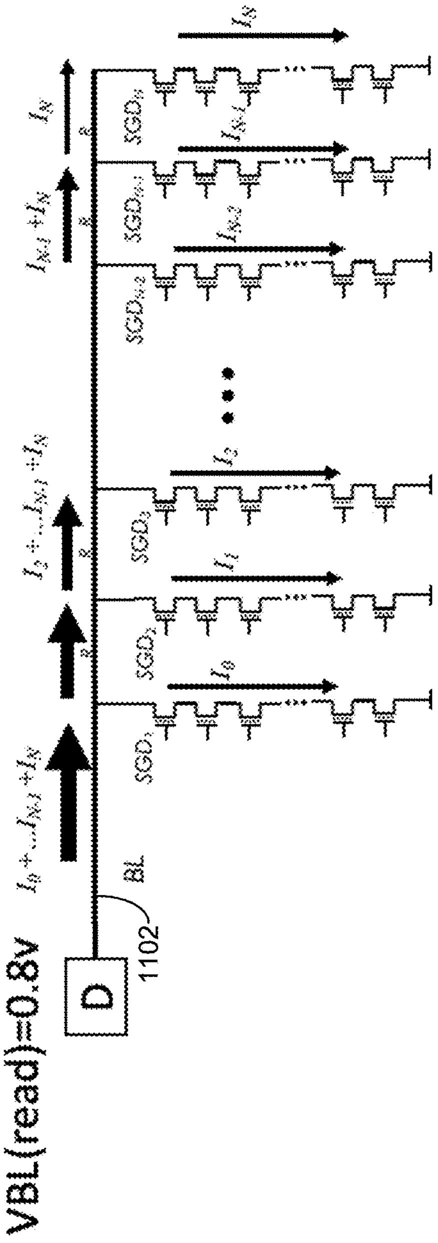
FIG. 15 depicts a voltage applied to NAND strings during a read process.

FIG. 15 depicts the same bit line 1102 connected to the same NAND strings as depicted in FIGS. 11A, 11B and 14A-F, implementing step 1304 of FIG. 13. FIG. 15 also shows bit line 1102 connected bit line driver D. FIG. 15 shows the voltage applied to the bit line as VBL=0.8 v, which is higher in voltage magnitude than the location dependent voltages of FIGS. 14A-F applied to the bit line during program-verify. As a result of the location dependent voltages of FIGS. 14A-F applied to the bit line during program-verify and the larger bit line voltage applied during read in FIG. 15, the differences in IR drop are compensated for such that the same $V_{DS}$ will be experienced during program-verify and read.

FIG. 16 is a flow chart of one embodiment of a process for adjusting bit line voltage during program-verify to compensate for different IR drops between program-verify and reading. The process of FIG. 16 is an example implementation of the process of FIG. 12 and/or the process of FIG. 13. In some example implementations, the process of FIG. 16 can be performed by any one of the one or more control circuits discussed above. The process of FIG. 16 can be performed entirely by a control circuit on memory die 200 (see FIG. 2A) or entirely by a control circuit on integrated memory assembly 207 (see FIG. 2B), rather than by memory controller 120. In one example, the process of FIG. 16 is performed by or at the direction of state machine 262, using other components of System Control Logic 260, Column Control Circuitry 210 and Row Control Circuitry 220. In another embodiment, the process of FIG. 16 is performed by memory controller 120 in combination with System Control Logic 260, Column Control Circuitry 210 and Row Control Circuitry 220. In some embodiments, the process of FIG. 16 is performed on any of the non-volatile memories discussed above.

In step 1618, the control circuit programs the non-volatile memory cells into a set of data states defined by current distributions (e.g., see FIG. 9) such that memory cells targeted for a first data state of the set of data states that are positioned in blocks farther from the bit line drivers are intentionally programmed to a higher memory cell current than memory cells targeted for the first data state that are positioned in blocks closer to the bit line drivers by using smaller bit line voltages during program-verify for memory cells positioned in blocks farther from the bit line drivers than bit line voltages used during program-verify for memory cells positioned in blocks closer to the bit line drivers (see e.g., FIGS. 14A-F). Step 1618 is an example implementation of steps 1202 and/or 1302.

In step 1620, the control circuit performs in-memory vector-matrix multiplication (see e.g. FIGS. 6-8). The vector-matrix multiplication is performed “in-memory” because it is performed inside memory structure 202. Step 1620 can be performed as part of step 524 of FIG. 5B, and is an example implementation of steps 1204 and/or 1304. In one embodiment, performing the vector-matrix multiplication of step 1620 comprises applying a VMM bit line voltage to selected bit lines of the plurality of bit lines in step 1622. The VMM bit line voltage is larger in voltage magnitude than the bit line voltages used during program-verify for memory cells positioned in blocks farther from the bit line drivers and the bit line voltages used during program-verify for memory cells positioned in blocks closer to the bit line drivers. The vector-matrix multiplication of step 1620 further comprises applying read enable voltages to the word lines (step 1624), applying an input vector to the select lines while applying the read enable voltages to the word lines (step 1626), and sensing output current from the selected bit lines (step 1628). In one embodiment, the sensing output current from the selected bit lines comprises sensing total current (sum of all currents received) on a bit line while the bit line concurrently receives current from all/some NAND strings in every region of every block of a plane.

Figure 17:
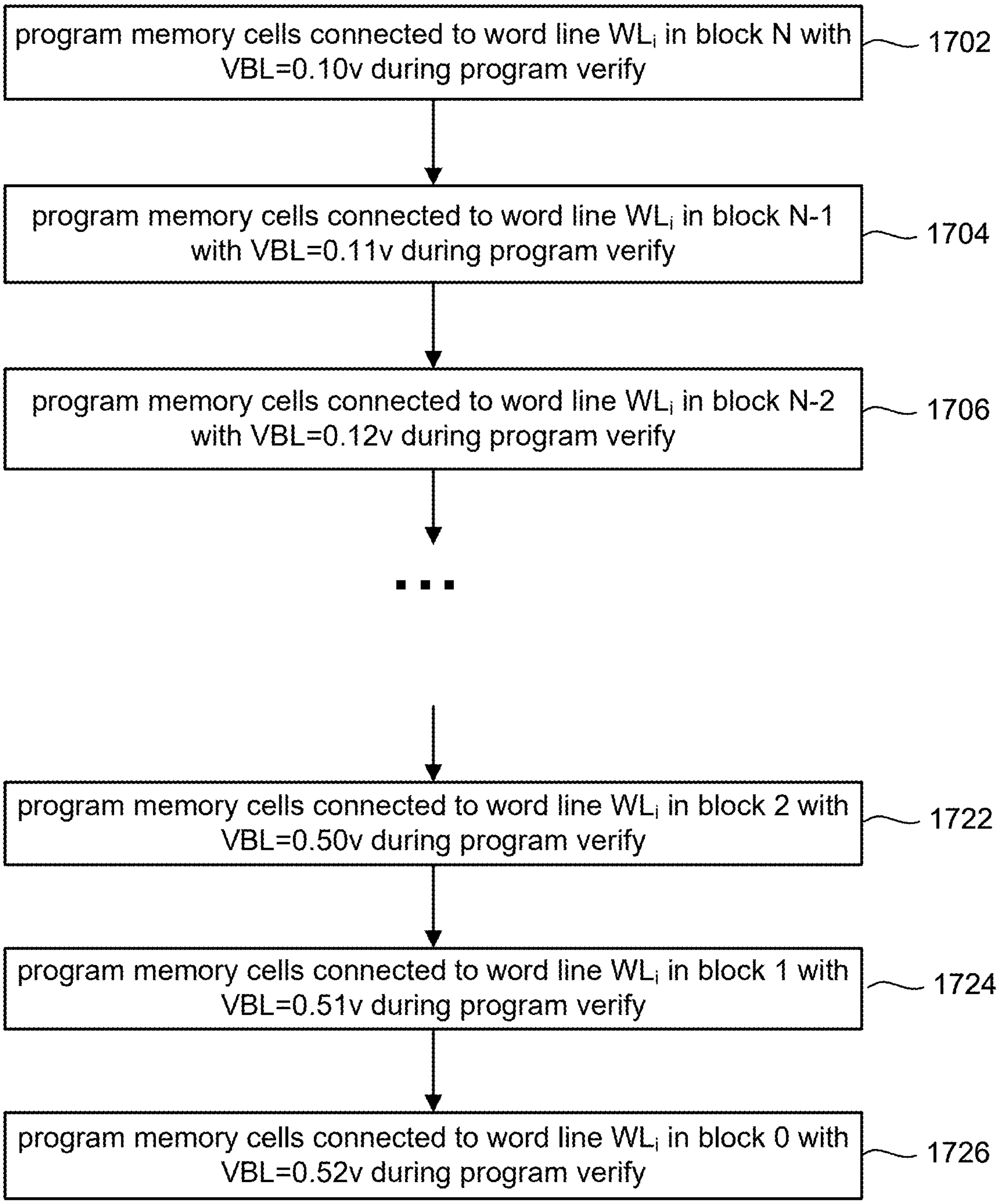
FIG. 17 is a flow chart describing one embodiment of a process for programming memory cells.

FIG. 17 is a flow chart of one embodiment of a process for programming memory cells to implement the location dependent bit line voltages of FIGS. 14A-F as part of step 1618 of FIG. 16. In some example implementations, the process of FIG. 17 can be performed by any one of the one or more control circuits discussed above. The process of FIG. 17 can be performed entirely by a control circuit on memory die 200 (see FIG. 2A) or entirely by a control circuit on integrated memory assembly 207 (see FIG. 2B), rather than by memory controller 120. In one example, the process of FIG. 17 is performed by or at the direction of state machine 262, using other components of System Control Logic 260, Column Control Circuitry 210 and Row Control Circuitry 220. In another embodiment, the process of FIG. 17 is performed by memory controller 120 in combination with System Control Logic 260, Column Control Circuitry 210 and Row Control Circuitry 220. In some embodiments, the process of FIG. 17 is performed on any of the non-volatile memories discussed above.

In step 1702, the control circuit programs memory cells connected to word line $WL_i$ that are in block N using VBL=0.10 v during program-verify (as depicted in FIG. 14A). In step 1704, the control circuit programs memory cells connected to word line $WL_i$ that are in block N−1 using VBL=0.11 v during program-verify (as depicted in FIG. 14B). In step 1706, the control circuit programs memory cells connected to word line $WL_i$ that are in block N−2 using VBL=0.12 v during program-verify (as depicted in FIG. 14C). And so on, the process continues for the other blocks in the plane. In step 1722, the control circuit programs memory cells connected to word line $WL_i$ that are in block 2 using VBL=0.50 v during program-verify (as depicted in FIG. 14D). In step 1724, the control circuit programs memory cells connected to word line $WL_i$ that are in block 1 using VBL=0.51 v during program-verify (as depicted in FIG. 14E). In step 1726, the control circuit programs memory cells connected to word line $WL_i$ that are in block 0 using VBL=0.52 v during program-verify (as depicted in FIG. 14F).

Figures 18A, 18B, 18C, 18D, 18E, 18F, 18G, 18H, 18I, 18J, 18K, 18L:
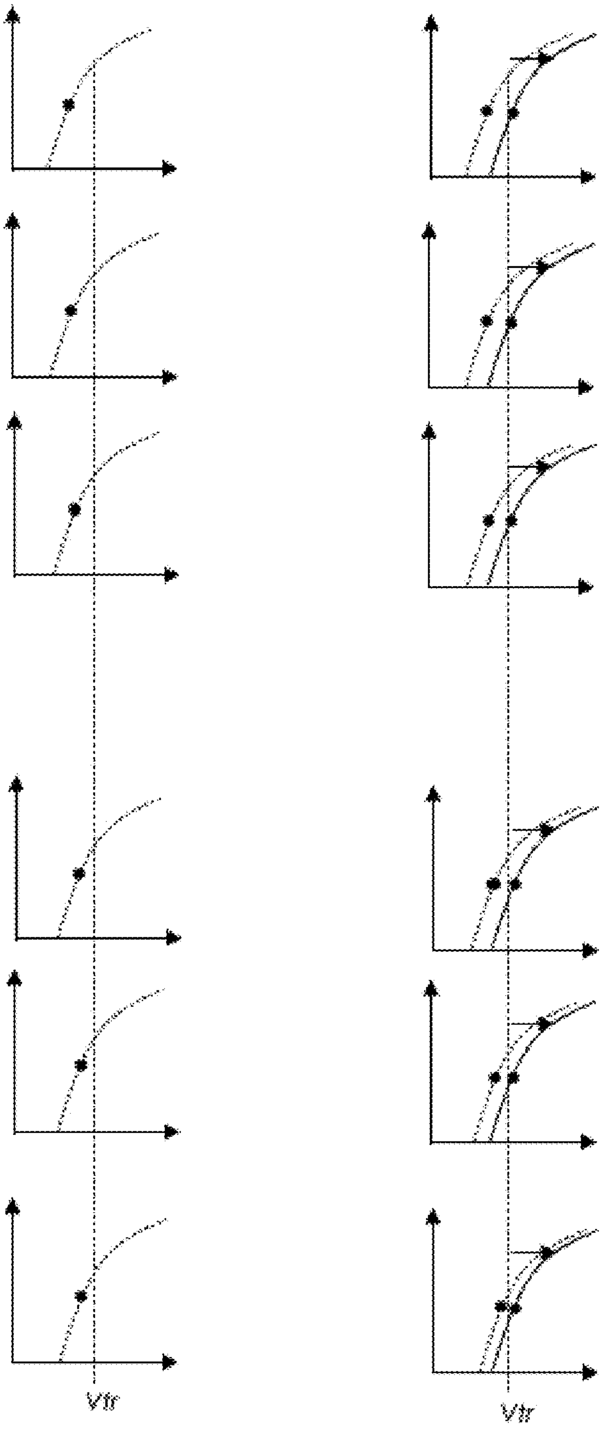
FIGS. 18A-L depicts IV curves for memory cells.

FIGS. 18A-L are IV curves for memory cells on NAND strings configured to store weights for VMM. Specifically, FIG. 18A depicts an IV curve for memory cells connected to word line $WL_i$ in block N that were programmed in step 1702 with VBL=0.10 v during program-verify, as per FIG. 14A. FIG. 18B depicts two IV curves. The IV curve on the left is the same as the IV curve in FIG. 18A. The IV curve on the right in FIG. 18B depicts the IV curve for the same memory cells connected to word line $WL_i$ in block N of FIG. 18A but during a read operation with VBL−0.8 v (as per FIG. 15). Reading with the higher bit line voltage shifts the IV curve to the right so that the memory cells are read at the appropriate current in response to applying the voltage Vtr to the control gate (and word line).

FIG. 18C depicts an IV curve for memory cells connected to word line $WL_i$ in block N−1 that were programmed in step 1704 with VBL=0.11 v during program-verify, as per FIG. 14B. FIG. 18D depicts two IV curves. The IV curve on the left is the same as the IV curve in FIG. 18C. The IV curve on the right in FIG. 18D depicts the IV curve for the same memory cells connected to word line $WL_i$ in block N−1 of FIG. 18C but during a read operation with VBL=0.8 v (as per FIG. 15). Reading with the higher bit line voltage shifts the IV curve to the right so that the memory cells are read at the appropriate current in response to applying the voltage Vtr to the control gate (and word line).

FIG. 18E depicts an IV curve for memory cells connected to word line $WL_i$ in block N−2 that were programmed in step 1706 with VBL=0.12 v during program-verify, as per FIG. 14C. FIG. 18F depicts two IV curves. The IV curve on the left is the same as the IV curve in FIG. 18E. The IV curve on the right in FIG. 18F depicts the IV curve for the same memory cells connected to word line $WL_i$ in block N−2 of FIG. 18E but during a read operation with VBL=0.8 v (as per FIG. 15). Reading with the higher bit line voltage shifts the IV curve to the right so that the memory cells are read at the appropriate current in response to applying the voltage Vtr to the control gate (and word line).

FIG. 18G depicts an IV curve for memory cells connected to word line $WL_i$ in block 2 that were programmed in step 1722 with VBL=0.50 v during program-verify, as per FIG. 14D. FIG. 18H depicts two IV curves. The IV curve on the left is the same as the IV curve in FIG. 18G. The IV curve on the right in FIG. 18H depicts the IV curve for the same memory cells connected to word line $WL_i$ in block 2 of FIG. 18G but during a read operation with VBL=0.8 v (as per FIG. 15). Reading with the higher bit line voltage shifts the IV curve to the right so that the memory cells are read at the appropriate current in response to applying the voltage Vtr to the control gate (and word line).

FIG. 18I depicts an IV curve for memory cells connected to word line $WL_i$ in block 1 that were programmed in step 1724 with VBL=0.51 v during program-verify, as per FIG. 14E. FIG. 18J depicts two IV curves. The IV curve on the left is the same as the IV curve in FIG. 18I. The IV curve on the right in FIG. 18J depicts the IV curve for the same memory cells connected to word line $WL_i$ in block 1 of FIG. 18I but during a read operation with VBL=0.8 v (as per FIG. 15). Reading with the higher bit line voltage shifts the IV curve to the right so that the memory cells are read at the appropriate current in response to applying the voltage Vtr to the control gate (and word line).

FIG. 18K depicts an IV curve for memory cells connected to word line $WL_i$ in block 0 that were programmed in step 1726 with VBL=0.52 v during program-verify, as per FIG. 14F. FIG. 18L depicts two IV curves. The IV curve on the left is the same as the IV curve in FIG. 18K. The IV curve on the right in FIG. 18L depicts the IV curve for the same memory cells connected to word line $WL_i$ in block 0 of FIG. 18K but during a read operation with VBL=0.8 v (as per FIG. 15). Reading with the higher bit line voltage shifts the IV curve to the right so that the memory cells are read at the appropriate current in response to applying the voltage Vtr to the control gate (and word line).

A non-volatile storage apparatus has been proposed that adjusts but line voltage during program-verify to compensate for different IR drops between program-verify and reading.

One embodiment includes a non-volatile storage apparatus comprising a plurality of non-volatile memory cells (the plurality of non-volatile memory cells include a first memory cell); a first bit line connected the plurality of non-volatile memory cells including the first memory cell; and a control circuit connected to the plurality of non-volatile memory cells and the first bit line. The control circuit is configured to: apply a first bit line voltage to the first bit line during program verify for the first memory cell, and apply a second bit line voltage to the first bit line during a first read process for the first memory cell, the first bit line voltage applied during program-verify is lower in voltage magnitude than the second bit line voltage applied during the first read process.

In one example implementation, the control circuit includes a bit line driver connected to the first bit line, and the control circuit configured to apply location dependent bit line voltages to the first bit line connected to the plurality of non-volatile memory cells during separate program-verify processes for the plurality of non-volatile memory cells and apply the second bit line voltage to the first bit line during read processes for the plurality of non-volatile memory cells, the location dependent bit line voltages are all lower in voltage magnitude than the second bit line voltage, the location dependent bit line voltages are different in voltage magnitude for different locations based on distance from the bit line driver.

In one example implementation, the plurality of non-volatile memory cells are positioned in blocks of memory cells; the control circuit includes a bit line driver connected to the first bit line; and the control circuit configured to apply block dependent bit line voltages to the first bit line connected to the plurality of non-volatile memory cells during separate program-verify processes for the plurality of memory cells, and apply the second bit line voltage to the first bit line during read processes for the plurality of non-volatile memory cells, the block dependent bit line voltages are all lower in voltage magnitude than the second bit line voltage, the block dependent bit line voltages are different in voltage magnitude for different blocks of memory cells based on distance from the bit line driver.

In one example implementation, the control circuit includes a bit line driver connected to the first bit line; and the control circuit configured to program the plurality of non-volatile memory cells into a set of data states defined by current distributions such that memory cells targeted for a first data state of the set of data states that are positioned in locations farther from the bit line driver are intentionally programmed to a higher memory cell current than memory cells targeted for the first data state that are positioned closer to the bit line driver by using smaller bit line voltages during program-verify for memory cells positioned in locations farther from the bit line driver than bit line voltages used during program-verify for memory cells positioned in locations closer to the bit line driver.

In one example implementation, the plurality of non-volatile memory cells are positioned in blocks of memory cells; the control circuit includes a bit line driver connected to the first bit line; and the control circuit configured to program the plurality of non-volatile memory cells into a set of data states defined by current distributions such that memory cells targeted for a first data state of the set of data states that are positioned in a block farther from the bit line driver are intentionally programmed to a higher memory cell current than memory cells targeted for the first data state that are positioned in a block closer to the bit line driver by using smaller bit line voltages during program-verify for memory cells positioned in the block farther from the bit line driver than bit line voltages used during program-verify for memory cells positioned in the block closer to the bit line driver.

In one example implementation, the plurality of non-volatile memory cells are positioned in blocks of memory cells; the control circuit includes a bit line driver connected to the first bit line; and the control circuit configured to program the plurality of non-volatile memory cells into a set of data states defined by current distributions such that memory cells targeted for a first data state of the set of data states that are positioned in a block farther from the bit line driver are programmed using a smaller bit line voltage during program-verify and memory cells targeted for the first data state that are positioned in a block closer to the bit line driver are programmed using a larger bit line voltage during program-verify, the smaller bit line voltage and the larger bit line voltage are lower in voltage magnitude than the than the second bit line voltage.

In one example implementation, the plurality of non-volatile memory cells are positioned in blocks of memory cells; the control circuit includes a bit line driver connected to the first bit line; and the control circuit configured to program the plurality of non-volatile memory cells into a set of data states defined by current distributions such during program-verify the control circuit applies a bit line voltage VBL to the first bit line defined by VBL=VBL0−n(a), where VBL0 is the bit line voltage applied during program verify for a block closest to the bit line driver, "a" is equal to a constant and n is a number of blocks away from the block closest to the bit line driver.

In one example implementation, the non-volatile storage apparatus further comprises multiple bit lines; the control circuit is configured to store weight information in the plurality of non-volatile memory cells during one or more programming processes that includes the applying the first bit line voltage to the first bit line during program verify for the first memory cell; and the control circuit is configured to perform vector-matrix multiplication in-memory using the weight information stored in the plurality of non-volatile memory cells by sensing output current from the multiple bit lines and the first bit line during one or more read processes that include the applying the second bit line voltage to the first bit line during the first read process.

In one example implementation, the non-volatile storage apparatus further comprises multiple bit lines and additional memory cells connected to the multiple bit lines; the control circuit includes bit line drivers connected to the first bit line and the multiple bit lines; and the control circuit is configured to store weight information in the plurality of non-volatile memory cells and the additional memory cells during one or more programming processes that include applying location dependent bit line voltages to multiple bit lines and the first bit lines during program-verify processes for the plurality of non-volatile memory cells and the additional memory cells, and perform vector-matrix multiplication in-memory using the weight information stored in the plurality of non-volatile memory cells and the additional memory cells by sensing output current from the multiple bit lines and the first bit line during one or more read processes that includes applying the second bit line voltage to the first bit line and to the multiple bit lines during read processes for the plurality of non-volatile memory cells and the additional memory cells, the location dependent bit line voltages are all lower in voltage magnitude than the second bit line voltage, the location dependent bit line voltages are different in voltage magnitude for different locations based on distance from the first bit line driver.

In one example implementation, the plurality of non-volatile memory cells are positioned on NAND strings; the NAND strings include select gates; the non-volatile storage apparatus further comprises a plurality of select lines connected to the select gates and the control circuit; the control circuit is configured to store weight information in the plurality of memory cells by programming the plurality of memory cells into a set of data states defined by current distributions, the programming includes the applying the first bit line voltage to the first bit line during program verify for the first memory cell; and the control circuit is configured to perform vector-matrix multiplication in-memory using the weight information stored in the plurality of memory cells including applying an input vector to the select lines and sensing output current from the first bit line while the first bit line concurrently receives current from multiple NAND strings.

One embodiment includes a method comprising programming a plurality of memory cells, the programming includes performing program-verify for the plurality of memory cells, performing program-verify comprises applying location dependent bit line voltages to a first bit line connected to the plurality of memory cells, the location dependent bit line voltages are different in voltage magnitude for different locations based on distance from a first bit line driver connected to the first bit line, and reading the plurality of memory cells while applying a common bit line voltage to the first bit line.

In one example implementation, the location dependent bit line voltages are all lower in voltage magnitude than the common bit line voltage.

In one example implementation, the location dependent bit line voltages include a first bit line voltage for a location near the first bit line driver and a second bit line voltage for a location further from the first bit driver, the first bit line voltage is larger in voltage magnitude than the second bit line voltage.

In one example implementation, the performing program-verify comprises applying block dependent bit line voltages to the first bit line connected to the plurality of memory cells, the block dependent bit line voltages are different in voltage magnitude for different blocks based on distance from the first bit line driver connected to the first bit line.

In one example implementation, the block dependent bit line voltages include a first bit line voltage for a block near the first bit line driver and a second bit line voltage for a block further from the first bit driver, the first bit line voltage is larger in voltage magnitude than the second bit line voltage.

In one example implementation, the programming the plurality of memory cells includes programming the plurality of memory cells into a set of data states defined by current distributions such that a memory cell targeted for a first data state of the set of data states that is positioned in a block farther from the bit line drivers is programmed to a higher memory cell current than a memory cell targeted for the first data state that is positioned in a block closer to the bit line driver by using a smaller bit line voltage during program-verify for the memory cell positioned in the block farther from the bit line driver than a bit line voltage used during program-verify for the memory cell positioned in the block closer to the bit line driver.

One example implementation further comprises performing vector-matrix multiplication in-memory using weights stored in the plurality of memory cells, the reading the plurality of memory cells while applying the common bit line voltage to the first bit line is part of the performing vector-matrix multiplication, the programming the plurality of memory cells programs the weights into the plurality of memory cells.

One example implementation further comprises performing vector-matrix multiplication in-memory using weights stored in the plurality of memory cells, the programming the plurality of memory cells programs the weights into the plurality of memory cells, the plurality of memory cells are positioned on NAND strings, the NAND strings include select gates connected to select lines, the reading the plurality of memory cells while applying the common bit line voltage to the first bit line is part of the performing vector-matrix multiplication, the performing vector-matrix multiplication in-memory includes sensing output current from the first bit line while the first bit line concurrently receives current from multiple NAND strings and in response to an input vector applied to the select lines.

In one example implementation, the plurality of memory cells are positioned on NAND strings; the performing program-verify for the plurality of memory cells comprises performing program-verify one NAND string at a time; and the reading the plurality of memory cells while applying the common bit line voltage to the first bit line comprises concurrently reading from memory cells on multiple NAND strings connected to the first bit line.

One embodiment includes a non-volatile storage apparatus that includes NAND strings comprising non-volatile memory cells and select gates such that the NAND strings are grouped into a plurality of blocks; a plurality of word lines connected to the non-volatile memory cells; a plurality of bit lines connected to the NAND strings, each of the bit lines are connected to NAND strings in multiple regions of every block of the plurality of blocks; a plurality of select lines connected to the select gates; and a control circuit connected to the word lines and the select lines. The control circuit includes bit line drivers connected to the bit lines. The control circuit is configured to program the non-volatile memory cells into a set of data states defined by current distributions such that memory cells targeted for a first data state of the set of data states that are positioned in blocks farther from the bit line drivers are intentionally programmed to a higher memory cell current than memory cells targeted for the first data state that are positioned in blocks closer to the bit line drivers by using smaller bit line voltages during program-verify for memory cells positioned in blocks farther from the bit line drivers than bit line voltages used during program-verify for memory cells positioned in blocks closer to the bit line drivers. The control circuit is configured to perform in-memory vector-matrix multiplication (VMM) by: applying a VMM bit line voltage to selected bit lines of the plurality of bit lines, the VMM bit line voltage is larger in voltage magnitude than the smaller bit line voltages used during program-verify for memory cells positioned in blocks farther from the bit line drivers and the bit line voltages used during program-verify for memory cells positioned in blocks closer to the bit line drivers, applying read enable voltages to the word lines, applying an input vector to the select lines while applying the read enable voltages to the word lines, and sensing output current from the selected bit lines.

One embodiment includes a non-volatile storage apparatus comprising a plurality of non-volatile memory cells; a first bit line connected the plurality of non-volatile memory cells; and a control circuit connected to the plurality of non-volatile memory cells and the first bit line. The control circuit is configured to program the plurality of memory cells. The programming includes performing program-verify for the plurality of memory cells. The performing program-verify comprises applying location dependent bit line voltages to a first bit line connected to the plurality of memory cells. The location dependent bit line voltages are different in voltage magnitude for different locations based on distance from a first bit line driver connected to the first bit line. The control circuit is further configured to read the plurality of memory cells while applying a common bit line voltage to the first bit line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:

a plurality of non-volatile memory cells, the plurality of non-volatile memory cells include a first memory cell;

a first bit line connected the plurality of non-volatile memory cells including the first memory cell; and a control circuit connected to the plurality of non-volatile memory cells and the first bit line, the control circuit includes a bit line driver connected to the first bit line, the control circuit is configured to:

apply location dependent bit line voltages to the first bit line connected to the plurality of non-volatile memory cells during separate program-verify processes for the plurality of non-volatile memory cells, and apply a second bit line voltage to the first bit line during read processes for the plurality of non-volatile memory cells, the location dependent bit line voltages are all lower in voltage magnitude than the second bit line voltage, the location dependent bit line voltages are different in voltage magnitude for different locations based on distance from the bit line driver.

2. The non-volatile storage apparatus of claim 1, wherein:

the plurality of non-volatile memory cells are positioned in blocks of memory cells; and the location dependent bit line voltages are block dependent bit line voltages.

3. The non-volatile storage apparatus of claim 1, wherein:

the control circuit is configured to program the plurality of non-volatile memory cells into a set of data states defined by current distributions such that memory cells targeted for a first data state of the set of data states that are positioned in locations farther from the bit line driver are intentionally programmed to a higher memory cell current than memory cells targeted for the first data state that are positioned closer to the bit line driver by using smaller bit line voltages during program-verify for memory cells positioned in locations farther from the bit line driver than bit line voltages used during program-verify for memory cells positioned in locations closer to the bit line driver.

4. The non-volatile storage apparatus of claim 1, wherein:

the plurality of non-volatile memory cells are positioned in blocks of memory cells; and the control circuit configured to program the plurality of non-volatile memory cells into a set of data states defined by current distributions such that memory cells targeted for a first data state of the set of data states that are positioned in a block farther from the bit line driver are intentionally programmed to a higher memory cell current than memory cells targeted for the first data state that are positioned in a block closer to the bit line driver by using smaller bit line voltages during program-verify for memory cells positioned in the block farther from the bit line driver than bit line voltages used during program-verify for memory cells positioned in the block closer to the bit line driver.

5. The non-volatile storage apparatus of claim 1, wherein:

the plurality of non-volatile memory cells are positioned in blocks of memory cells; and the control circuit configured to program the plurality of non-volatile memory cells into a set of data states defined by current distributions such that memory cells targeted for a first data state of the set of data states that are positioned in a block farther from the bit line driver are programmed using a smaller bit line voltage during program-verify and memory cells targeted for the first data state that are positioned in a block closer to the bit line driver are programmed using a larger bit line voltage during program-verify, the smaller bit line voltage and the larger bit line voltage are lower in voltage magnitude than the than the second bit line voltage.

6. The non-volatile storage apparatus of claim 1, wherein:

the plurality of non-volatile memory cells are positioned in blocks of memory cells; and the control circuit configured to program the plurality of non-volatile memory cells into a set of data states defined by current distributions such during program-verify the control circuit applies a bit line voltage VBL to the first bit line defined by $VBL=VBL_0-n(a)$, where $VBL_0$ is the bit line voltage applied during program verify for a block closest to the bit line driver, “a” is equal to a constant and n is a number of blocks away from the block closest to the bit line driver.

7. The non-volatile storage apparatus of claim 1, wherein:

the non-volatile storage apparatus further comprises multiple bit lines;

the control circuit is configured to store weight information in the plurality of non-volatile memory cells during one or more programming processes; and the control circuit is configured to perform vector-matrix multiplication in-memory using the weight information stored in the plurality of non-volatile memory cells by sensing output current from the multiple bit lines and the first bit line during one or more read processes that include the applying the second bit line voltage to the first bit line during the first read process.

8. The non-volatile storage apparatus of claim 1, wherein:

the non-volatile storage apparatus further comprises multiple bit lines and additional memory cells connected to the multiple bit lines;

the control circuit includes bit line drivers connected to the first bit line and the multiple bit lines; and the control circuit is configured to:

store weight information in the plurality of non-volatile memory cells and the additional memory cells during one or more programming processes that include applying location dependent bit line voltages to the multiple bit lines and the first bit lines during program-verify processes for the plurality of non-volatile memory cells and the additional memory cells, and perform vector-matrix multiplication in-memory using the weight information stored in the plurality of non-volatile memory cells and the additional memory cells by sensing output current from the multiple bit lines and the first bit line during one or more read processes that includes applying the second bit line voltage to the first bit line and to the multiple bit lines during read processes for the plurality of non-volatile memory cells and the additional memory cells, the location dependent bit line voltages are all lower in voltage magnitude than the second bit line voltage, the location dependent bit line voltages are different in voltage magnitude for different locations based on distance from the first bit line driver.

9. The non-volatile storage apparatus of claim 1, wherein:

the plurality of non-volatile memory cells are positioned on NAND strings;

the NAND strings include select gates;

the non-volatile storage apparatus further comprises a plurality of select lines connected to the select gates and the control circuit;

the control circuit is configured to store weight information in the plurality of memory cells by programming the plurality of memory cells into a set of data states defined by current distributions; and the control circuit is configured to perform vector-matrix multiplication in-memory using the weight information stored in the plurality of memory cells including applying an input vector to the select lines and sensing output current from the first bit line while the first bit line concurrently receives current from multiple NAND strings.

10. A method comprising:

programming a plurality of memory cells, the programming includes performing program-verify for the plurality of memory cells, performing program-verify comprises applying location dependent bit line voltages to a first bit line connected to the plurality of memory cells, the location dependent bit line voltages are different in voltage magnitude for different locations based on distance from a first bit line driver connected to the first bit line; and reading the plurality of memory cells while applying a common bit line voltage to the first bit line, the location dependent bit line voltages are all lower in voltage magnitude than the common bit line voltage.

11. The method of claim 10, wherein:

the location dependent bit line voltages include a first bit line voltage for a location near the first bit line driver and a second bit line voltage for a location further from the first bit driver, the first bit line voltage is larger in voltage magnitude than the second bit line voltage.

12. The method of claim 10, wherein:

the performing program-verify comprises applying block dependent bit line voltages to the first bit line connected to the plurality of memory cells, the block dependent bit line voltages are different in voltage magnitude for different blocks based on distance from the first bit line driver connected to the first bit line.

13. The method of claim 12, wherein:

the block dependent bit line voltages include a first bit line voltage for a block near the first bit line driver and a second bit line voltage for a block further from the first bit driver, the first bit line voltage is larger in voltage magnitude than the second bit line voltage.

14. The method of claim 10, wherein:

the programming the plurality of memory cells includes programming the plurality of memory cells into a set of data states defined by current distributions such that a memory cell targeted for a first data state of the set of data states that is positioned in a block farther from the bit line drivers is programmed to a higher memory cell current than a memory cell targeted for the first data state that is positioned in a block closer to the bit line driver by using a smaller bit line voltage during program-verify for the memory cell positioned in the block farther from the bit line driver than a bit line voltage used during program-verify for the memory cell positioned in the block closer to the bit line driver.

15. The method of claim 10, further comprising:

performing vector-matrix multiplication in-memory using weights stored in the plurality of memory cells, the reading the plurality of memory cells while applying the common bit line voltage to the first bit line is part of the performing vector-matrix multiplication, the programming the plurality of memory cells programs the weights into the plurality of memory cells.

16. The method of claim 10, further comprising:

performing vector-matrix multiplication in-memory using weights stored in the plurality of memory cells, the programming the plurality of memory cells programs the weights into the plurality of memory cells, the plurality of memory cells are positioned on NAND strings, the NAND strings include select gates connected to select lines, the reading the plurality of memory cells while applying the common bit line voltage to the first bit line is part of the performing vector-matrix multiplication, the performing vector-matrix multiplication in-memory includes sensing output current from the first bit line while the first bit line concurrently receives current from multiple NAND strings and in response to an input vector applied to the select lines.

17. The method of claim 10, wherein:

the plurality of memory cells are positioned on NAND strings;

the performing program-verify for the plurality of memory cells comprises performing program-verify one NAND string at a time; and the reading the plurality of memory cells while applying the common bit line voltage to the first bit line comprises concurrently reading from memory cells on multiple NAND strings connected to the first bit line.

18. A non-volatile storage apparatus, comprising:

NAND strings comprising non-volatile memory cells and select gates, the NAND strings are grouped into a plurality of blocks;

a plurality of word lines connected to the non-volatile memory cells;

a plurality of bit lines connected to the NAND strings, each of the bit lines are connected to NAND strings in multiple regions of every block of the plurality of blocks;

a plurality of select lines connected to the select gates; and a control circuit connected to the word lines and the select lines, the control circuit includes bit line drivers connected to the bit lines, the control circuit is configured to program the non-volatile memory cells into a set of data states defined by current distributions such that memory cells targeted for a first data state of the set of data states that are positioned in blocks farther from the bit line drivers are intentionally programmed to a higher memory cell current than memory cells targeted for the first data state that are positioned in blocks closer to the bit line drivers by using smaller bit line voltages during program-verify for memory cells positioned in blocks farther from the bit line drivers than bit line voltages used during program-verify for memory cells positioned in blocks closer to the bit line drivers;

the control circuit is configured to perform in-memory vector-matrix multiplication (VMM) by:

applying a VMM bit line voltage to selected bit lines of the plurality of bit lines, the VMM bit line voltage is larger in voltage magnitude than the smaller bit line voltages used during program-verify for memory cells positioned in blocks farther from the bit line drivers and the bit line voltages used during program-verify for memory cells positioned in blocks closer to the bit line drivers, applying read enable voltages to the word lines, applying an input vector to the select lines while applying the read enable voltages to the word lines, and sensing output current from the selected bit lines.

* * * * *